US008217866B2

(12) United States Patent
Ryu et al.

(10) Patent No.: US 8,217,866 B2
(45) Date of Patent: Jul. 10, 2012

(54) DATA DRIVING CIRCUIT AND DRIVING METHOD OF LIGHT EMITTING DISPLAY USING THE SAME

(75) Inventors: Do Hyung Ryu, Suwon (KR); Bo Yong Chung, Seoul (KR); Oh Kyong Kwon, Seoul (KR)

(73) Assignees: Samsung Mobile Display Co., Ltd., Yongin (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 959 days.

(21) Appl. No.: 11/490,784

(22) Filed: Jul. 20, 2006

(65) Prior Publication Data

US 2007/0024540 A1 Feb. 1, 2007

(30) Foreign Application Priority Data

Aug. 1, 2005 (KR) ........................ 10-2005-0070433

(51) Int. Cl.
*G09G 3/30* (2006.01)
*G09G 3/10* (2006.01)
*G11C 19/00* (2006.01)

(52) U.S. Cl. ........... 345/77; 345/76; 345/78; 315/169.3; 377/72

(58) Field of Classification Search .............. 345/76–79, 345/82–83; 315/169.3; 377/64, 70–73
See application file for complete search history.

(56) References Cited

U.S. PATENT DOCUMENTS 6,552,702 B1 * 4/2003 Abe et al. ..................... 345/75.2
6,859,193 B1 2/2005 Yumoto
2003/0132906 A1 * 7/2003 Tanaka et al. ................... 345/89
2003/0146784 A1 * 8/2003 LeChevalier ................. 327/538
2003/0214468 A1 * 11/2003 Inukai ............................. 345/82
2004/0104870 A1 6/2004 Mametsuka
2004/0150436 A1 * 8/2004 Fukuzako ..................... 327/112
2008/0030438 A1 2/2008 Marx et al.

FOREIGN PATENT DOCUMENTS

EP 1 796 070 A1 6/2007

(Continued)

OTHER PUBLICATIONS

Korean Patent Abstracts, Publication No. 1020020034851 A, dated May 9, 2002, in the name of Yutaka Nanno et al.

(Continued)

*Primary Examiner* — Sumati Lefkowitz
*Assistant Examiner* — Jonathan Horner
(74) *Attorney, Agent, or Firm* — Christie, Parker & Hale, LLP

(57) ABSTRACT

A data driving circuit capable of displaying images having uniform brightness. The present invention provides a data driving circuit of a display device having: at least one current sinking unit for controlling a predetermined current to flow in a data line; at least one voltage generating unit for resetting voltage values of enhancement voltages using a compensation voltage generated when the predetermined current flows; at least one digital-analog converter for selecting as a data signal one of the enhancement voltages to correspond to a digital value of externally supplied data; at least one boosting unit for boosting a voltage value of the data signal; and at least one switching unit for providing the data line with the boosted data signal.

23 Claims, 16 Drawing Sheets

FOREIGN PATENT DOCUMENTS

| | | | |
|---|---|---|---|
| JP | 10-254410 | | 9/1998 |
| JP | 11-219146 | | 8/1999 |
| JP | 2002-311898 | | 10/2002 |
| JP | 2003-043993 | | 2/2003 |
| JP | 2003-058106 | | 2/2003 |
| JP | 2003-140613 | | 5/2003 |
| JP | 2003-295828 | | 10/2003 |
| JP | 2004-004675 | | 1/2004 |
| JP | 2004-125852 | | 4/2004 |
| JP | 2004-145197 | | 5/2004 |
| JP | 2004-192000 | | 7/2004 |
| JP | 2004-287345 | | 10/2004 |
| JP | 2007-536585 | | 12/2007 |
| KR | 2002-0034851 | | 5/2002 |
| KR | 10-2004-0018207 | | 3/2004 |
| WO | WO 2005/029456 | A1 | 3/2005 |
| WO | WO 2005/069267 | A1 | 7/2005 |

OTHER PUBLICATIONS

Korean Patent Abstracts, Publication No. 1020040018207 A, dated Mar. 2, 2004, in the name of Toshiyuki Kasai.

In, H et al., *A Novel Voltage-Programming Pixel with Current-Correction Method for Large Size and High-Resolution AMOLEDs on Ply-Si Backplane*, IMID Digest Jul. 23, 2005, pp. 901-904, XP-002405123.

European Search Report dated Jul. 24, 2007, for EP062518303.3, in the name of Samsung SDI Co., Ltd.

European Search Report dated Feb. 10, 2011, for corresponding European Patent application 06251830.3, noting listed reference in this IDS, as well as an article previously filed in an IDS dated Oct. 18, 2007.

Japanese Office action dated Sep. 21. 2010 issued by Japanese Patent Office for Japanese Patent Application No. 2006-080626.

* cited by examiner

DATA DRIVING CIRCUIT AND DRIVING METHOD OF LIGHT EMITTING DISPLAY USING THE SAME

CROSS-REFERENCE TO RELATED APPLICATION

This application claims priority to and the benefit of Korean Patent Application No. 10-2005-0070433, filed on Aug. 1, 2005, in the Korean Intellectual Property Office, the entire content of which is incorporated herein by reference.

BACKGROUND

1. Field of the Invention

The present invention relates to a data driving circuit, a light emitting display device using the same and a driving method of the light emitting display device, and more particularly, to a data driving circuit capable of displaying an image of uniform brightness, a light emitting display device using the same and a driving method of the light emitting display device.

2. Discussion of Related Art

Recently, various flat panel display devices have been developed to have weights and volumes that are less than cathode ray tubes. The flat panel display devices include liquid crystal display devices, field emission display devices, plasma display panels, light emitting display devices, etc.

As a flat panel display device, a light emitting display device presents images using a light emitting diode that generates the light by recombining electrons and holes. Such a light emitting display device has an advantage of having a high speed of response, as well as of being driven at a low power (i.e., having a low power consumption).

FIG. 1 is a diagram showing a conventional light emitting display device.

Referring to FIG. 1, the conventional light emitting display device includes a display region 30 including a plurality of pixels 40 connected with scanning lines S1 to Sn and data lines D1 to Dm; a scan driver 10 for driving the scanning lines S1 to Sn; a data driver 20 for driving the data lines D1 to Dm; and a timing controlling unit 50 for controlling the scan driver 10 and the data driver 20.

The timing controlling unit 50 generates a data driving controlling signal (DCS) and a scanning driving controlling signal (SCS) to correspond to synchronous signals supplied from the outside. The data driving controlling signal (DCS) generated in the timing controlling unit 50 is supplied to the data driver 20, and the scanning driving controlling signal (SCS) is supplied to the scan driver 10. In addition, the timing controlling unit 50 supplies data supplied from the outside to the data driver 20.

The scan driver 10 receives the scanning driving controlling signal (SCS) from the timing controlling unit 50. The scan driver 10 receiving the scanning driving controlling signal (SCS) generates a scanning signal, and the generated scanning signal is sequentially supplied to the scanning lines (S1 to Sn).

The data driver 20 receives the data driving controlling signal (DCS) from the timing controlling unit (or controller) 50. The data driver 20 receiving the data driving controlling signal (DCS) generates a data signal, and the generated data signal is supplied to the data lines (D1 to Dm) to be synchronized with the scanning signal.

The display region 30 receives a first power of a first power supply (ELVDD) and a second power of a second power supply (ELVSS) from the outside and then supplies them to each of the pixels 40. Each of the pixels 40 receiving the first power of the first power supply (ELVDD) and the second power of the second power supply (ELVSS) generates the light corresponding to the data signal by controlling a current to flow from the first power supply (ELVDD) to the second power supply (ELVSS) via the light emitting diode in response to the data signal.

That is, each of the pixels 40 generates the light of a predetermined brightness corresponding to the data signal in the conventional light emitting display device. However, the conventional light emitting display device has a problem in that it is unable to display an image of a desired brightness due to uneven threshold voltages and a deviation of electron mobility of the transistors included in the pixels 40 in the prior art. The threshold voltages of the transistors included in the pixels 40 are compensated to some extent by controlling a configuration of the pixel circuit included in each of the pixels 40, but the deviation of electron mobility is not compensated. Accordingly, there is need for a light emitting display device capable of displaying an even image (of uniform brightness) regardless of the deviation of electron mobility.

SUMMARY OF THE INVENTION

Accordingly, it is an aspect of the present invention to provide a data driving circuit capable of displaying an image of uniform brightness, a light emitting display device using the same and a driving method of the light emitting display device.

A first embodiment of the present invention provides a data driving circuit of a display device including: at least one current sinking unit for controlling a predetermined current to flow in a data line; at least one voltage generating unit for resetting voltage values of enhancement voltages using a compensation voltage generated when the predetermined current flows; at least one digital-analog converter for selecting as a data signal one of the enhancement voltages to correspond to a digital value of an externally supplied data; at least one boosting unit for boosting a voltage value of the data signals; and at least one switching unit for providing the data line with the boosted data signal.

In one embodiment, the at least one boosting unit boosts the voltage value of the data signal in response to a voltage-dropping voltage of the compensation voltage generated by an electrical load of the data line. The data line is connected with a pixel, the pixel charges a voltage using a voltage difference between a first reference power supply and the boosted data signal, and a driving current is controlled to flow from a first power supply to a light emitting diode to correspond to the charged voltage. The at least one boosting unit receives a voltage of the first reference power supply and a voltage of second reference power supply, and boosts the voltage value of the data signal to as much as a difference in voltage of the first reference power supply and the second reference power supply, and wherein the voltage of the second reference power supply is set by subtracting the voltage-dropping voltage from the voltage of the first reference power supply. The at least one voltage generating unit includes a plurality of partial potential resistances for generating the enhancement voltages, the partial potential resistances being mounted between a first side terminal for receiving the voltage of the second reference power supply and a second side terminal for receiving the compensation voltage.

A second embodiment of the present invention provides a data driving circuit of a display device including: at least one current sinking unit for receiving a predetermined current from a pixel connected with a data line and generating a compensation voltage in response to the received current; at least one boosting unit for boosting a voltage value of the compensation voltage; at least one voltage generating unit for resetting voltage values of the enhancement voltages using the boosted compensation voltage; at least one digital-analog converter for selecting as a data signal one of the enhancement voltages to correspond to a digital value of an externally supplied data; and at least one switching unit for providing the data line with the data signal.

In one embodiment, the at least one boosting unit boosts a voltage value of the compensation voltage to as much as a voltage-dropping voltage of the compensation voltage generated by loading of the data line. A pixel charges a voltage using a voltage difference between the first reference power supply and the data signal, and controls the current to flow from a first power supply to a light emitting diode in response to the charged voltage. The at least one boosting unit receives a voltage of the first reference power supply and a voltage of a second reference power supply, and boosts the voltage value of the data signal as much as a difference of the first reference power supply and the second reference power supply, and wherein the voltage of the second reference power supply is set by subtracting the voltage-dropping voltage from the voltage of the first reference power supply.

A third embodiment of the present invention provides a light emitting display device having: a display region including a plurality of pixels connected with at least one scanning line, at least one data line, and at least one light-emitting controlling line; a scan driver for supplying a scanning signal to the at least one scanning line, and supplying a light-emitting controlling signal to the at least one light-emitting controlling line; and at least one data driving circuit according to any of the above described embodiments for supplying the data signal to the data line.

A fourth embodiment of the present invention provides a method for driving a light emitting display device including: (a) controlling a predetermined current to flow in a data line connected with a pixel; (b) generating a compensation voltage corresponding to the predetermined current; (c) controlling voltage values of enhancement voltages using the compensation voltage; (d) selecting as a data signal one of the enhancement voltages to correspond to a digital value of an externally supplied data; and (e) boosting a voltage value of the data signal to supply the boosted data signal to the data line.

In one embodiment, in (a), the predetermined current is set to a current value being substantially the same as a current flowing when a pixel is light emitted with a maximum brightness. In (e), the data line boosts a voltage of the data signal to as much as a voltage-dropping voltage of the compensation voltage generated by its loading.

A fifth embodiment of the present invention provides a method for driving a light emitting display device including: (a) controlling a predetermined current to flow in a data line connected with a pixel; (b) boosting a compensation voltage generated to correspond to the predetermined current; (c) controlling voltage values of enhancement voltages using the boosted compensation voltage; (d) selecting as a data signal one of the enhancement voltages to correspond to a digital value of an externally supplied data supplied; and (e) supplying the data signal to the pixel via the data line.

In one embodiment, in (a), the predetermined current is set to a current value being substantially the same as a current flowing when a pixel is light emitted with a maximum brightness line. In (e), the data line boosts a voltage of the compensation voltage as much as a voltage-dropping voltage of the compensation voltage generated by its loading.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
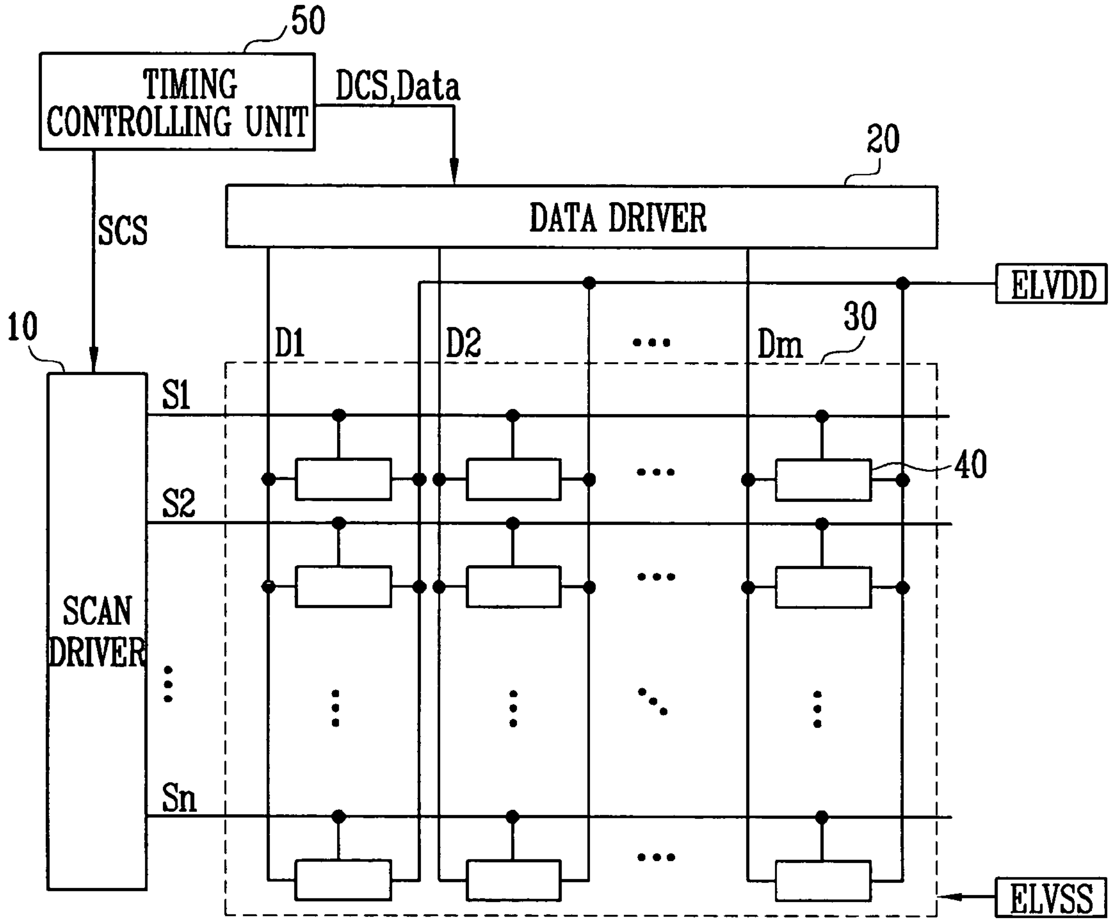
FIG. 1 (PRIOR ART)
FIG. 1 is a diagram showing a conventional light emitting display device.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements. Here, when a first element is connected to/with a second element, the first element may not only be directly connected to/with the second element but also be indirectly connected to/with the second element via a third element. Also, when a first element is on a second element, the first element may not only be directly on the second element but may also be indirectly on the second element via a third element.

Figure 2:
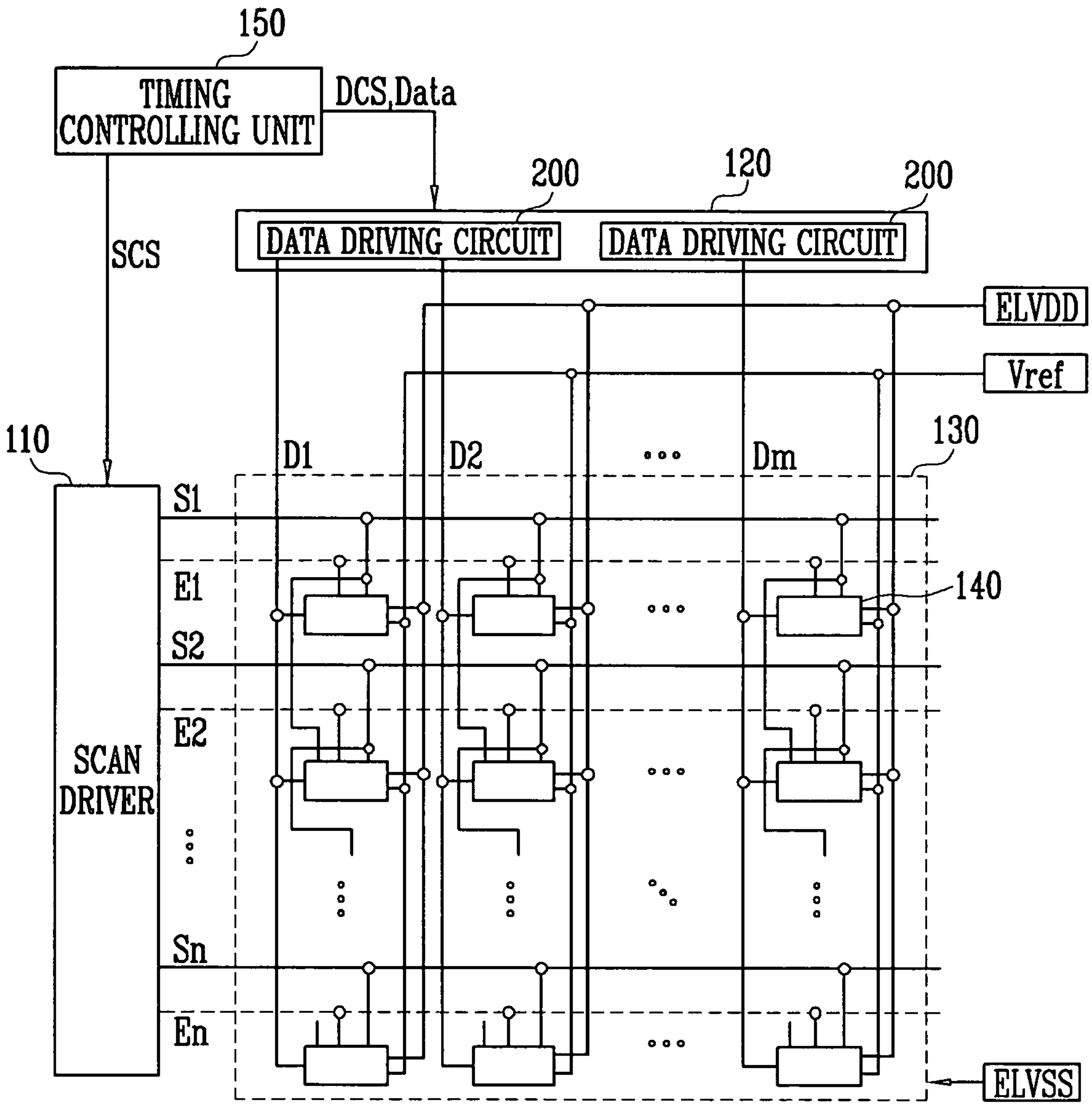
FIG. 2 is a diagram showing a light emitting display device according to an embodiment of the present invention.

FIG. 2 is a diagram showing a light emitting display device according to an embodiment of the present invention.

Referring to FIG. 2, the light emitting display device includes a display region 130 including a plurality of pixels 140 connected with scanning lines (S1 to Sn), light-emitting controlling lines (E1 to En), and data lines (D1 to Dm); a scan driver 110 for driving the scanning lines (S1 to Sn) and the light-emitting controlling lines (E1 to En); a data driver 120 for driving the data lines (D1 to Dm); and a timing controlling unit (or controller) 150 for controlling the scan driver 110 and the data driver 120.

Figure 3:
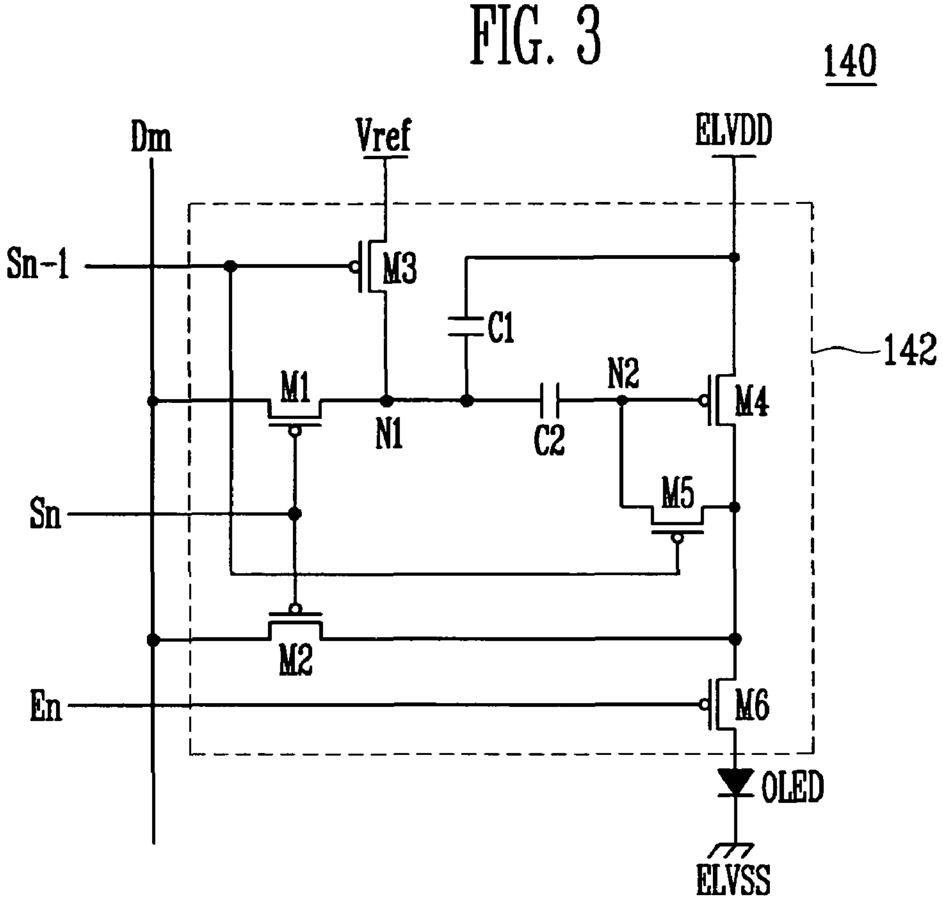
FIG. 3 is a circuit diagram showing an example of a pixel shown in FIG. 2.
Figure 5:
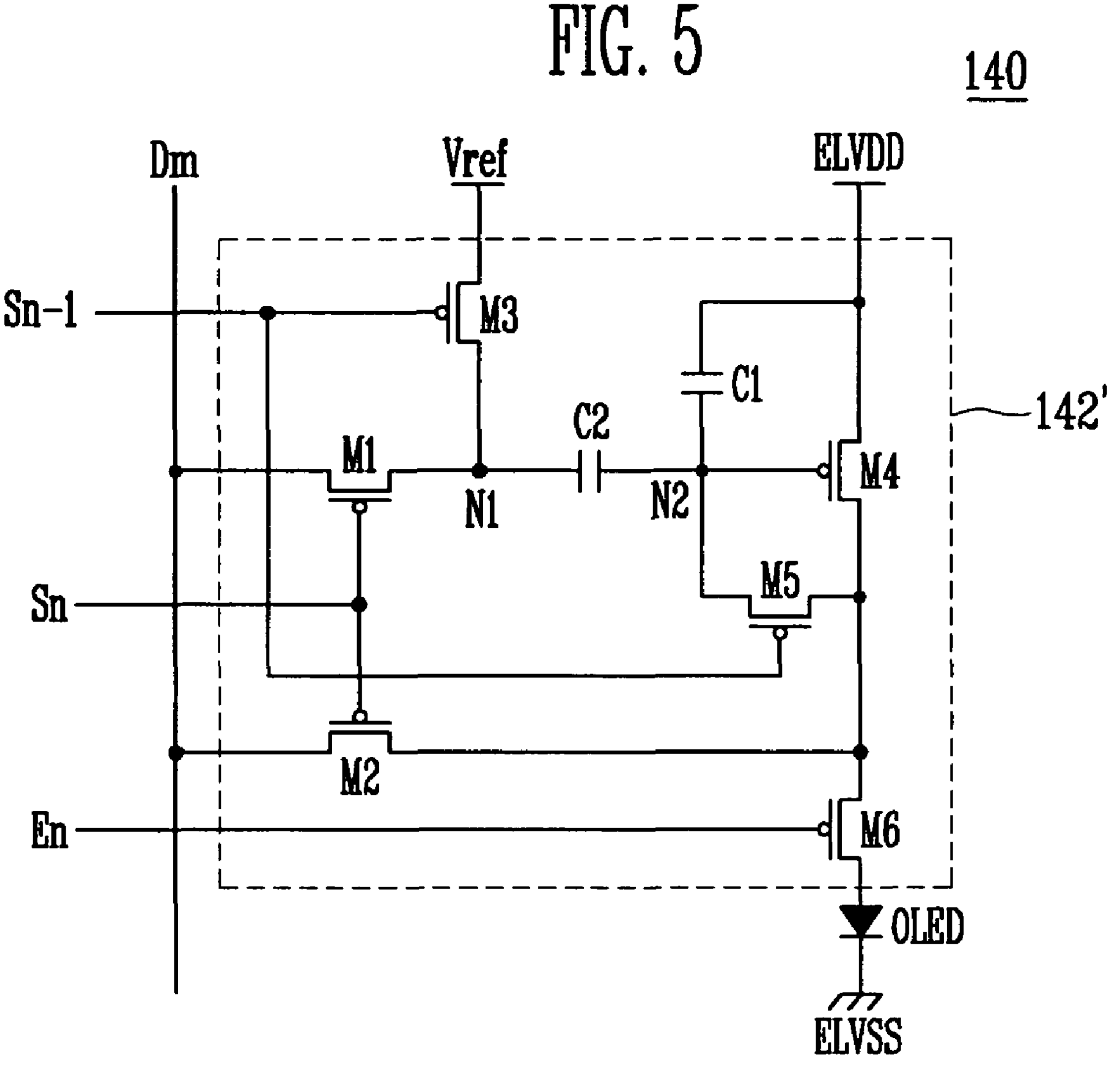
FIG. 5 is a circuit diagram showing another example of the pixel shown in FIG. 2.

The display region 130 includes pixels 140 formed in a region partitioned by the scanning lines (S1 to Sn), the light-emitting controlling lines (E1 to En), and the data lines (D1 to Dm). The pixels 140 receive a first power of a first power supply (ELVDD), a second power of a second power supply (ELVSS), and a reference power of a reference power supply (Vref) from the outside. Each of the pixels 140 receiving the reference power of the reference power supply (Vref) compensates a voltage drop of the first power of the first power supply (ELVDD) using the difference between the reference power of the reference power supply (Vref) and the first power of the first power supply (ELVDD). In addition, each of the pixels 140 supplies a predetermined current from the first power supply (ELVDD) to the second power supply (ELVSS) via the light emitting diode (not shown) so as to correspond to the data signal. For this purpose, each of the pixels 140 may be configured as shown in FIG. 3 or FIG. 5. The configuration of the pixel 140 will be described in more detail with reference to FIG. 3 and FIG. 5, as follows.

The timing controlling unit 150 generates a data driving controlling signal (DCS) and a scanning driving controlling signal (SCS) so as to correspond to synchronous signals supplied from the outside. The data driving controlling signal (DCS) generated in the timing controlling unit 150 is supplied to the data driver 120, and the scanning driving controlling signal (SCS) is supplied to the scan driver 110. In addition, the timing controlling unit 150 supplies the data supplied from the outside to the data driver 120.

The scan driver 110 receives the scanning driving controlling signal (SCS). The scan driver 110 receiving the scanning driving controlling signal (SCS) sequentially supplies a scanning signal to the scanning lines (S1 to Sn). In addition, the scan driver 110 receiving the scanning driving controlling signal (SCS) sequentially supplies a light-emitting controlling signal to the light-emitting controlling lines (E1 to En). At this time, the light-emitting controlling signal is supplied to be overlapped with two corresponding scanning signals. For this purpose, a width of the light-emitting controlling signal is set to be identical to or wider than that of the scanning signal.

The data driver 120 receives the data driving controlling signal (DCS) from the timing controlling unit 150. The data driver 120 receiving the driving controlling signal (DCS) generates a data signal and the generated data signal is supplied to the data lines (D1 to Dm). At this time, the data driver 120 supplies a predetermined current to the data lines (D1 to Dm) during a first period of a first horizontal interval (H), and also a predetermined current to the data lines (D1 to Dm) during a second period except the first period of the first horizontal interval (H). For this purpose, the data driver 120 includes at least one data driving circuit 200. The voltage supplied to the data lines (D1 to Dm) during the second period is referred to as a data signal for convenience of the description.

FIG. 3 is a diagram showing an example of the pixel 140 shown in FIG. 2. FIG. 3 shows the pixel connected with an $m^{th}$ data line (Dm), an $(n-1)^{th}$ and an $n^{th}$ scanning line (Sn−1, Sn) and an $n^{th}$ light-emitting controlling line (En) for convenience of the description.

Referring to FIG. 3, the pixel 140 of the present invention includes a pixel circuit 142 for supplying a current to a light emitting diode (OLED) and the light emitting diode (OLED).

The light emitting diode (OLED) generates lights of predetermined colors to correspond to the current supplied from the pixel circuit 142. For this purpose, the light emitting diode (OLED) is formed of organic materials, phosphorus materials and/or inorganic materials.

The pixel circuit 142 compensates a voltage drop (a voltage-dropping voltage) of the first power supply (ELVDD) and a threshold voltage of the fourth transistor (M4) when the scanning signals are supplied to the $(n-1)^{th}$ scanning line (Sn−1) (a previous scanning line), and charges a voltage corresponding to the data signal when the scanning signals are supplied to the $n^{th}$ scanning line (Sn) (a current scanning line). For this purpose, the pixel circuit 142 includes first to sixth transistors (M1 to M6) and a first capacitor (C1) and a second capacitor (C2).

The first electrode of the first transistor (M1) is connected to the data line (Dm), and the second electrode is connected a first node (N1). In addition, the gate electrode of the first transistor (M1) is connected to the $n^{th}$ scanning line (Sn). Such a first transistor (M1) turns on to connect the first node (N1) with the data line (Dm) when the scanning signal is supplied to the $n^{th}$ scanning line (Sn).

The first electrode of the second transistor (M2) is connected to the data line (Dm), and the second electrode is connected to the second electrode of the fourth transistor (M4). In addition, the gate electrode of the second transistor (M2) is connected to the $n^{th}$ scanning line (Sn). Such a second transistor (M2) turns on to electrically connect the second electrode of the fourth transistor (M4) with the data line (Dm) when the scanning signals are supplied to the $n^{th}$ scanning line (Sn).

The first electrode of the third transistor (M3) is connected to the reference power supply (Vref), and the second electrode is connected to the first node (N1). In addition, the gate electrode of the third transistor (M3) is connected to the $(n-1)^{th}$ scanning line (Sn−1). Such a third transistor (M3) turns on to electrically connect the first node (N1) with the reference power supply (Vref) when the scanning signals are supplied to the $(n-1)^{th}$ scanning line (Sn−1).

The first electrode of the fourth transistor (M4) is connected to the first power supply (ELVDD), and the second electrode is connected to the first electrode of the sixth transistor (M6). In addition, the gate electrode of the fourth transistor (M4) is connected to the second node (N2). Such a fourth transistor (M4) supplies to the first electrode of the sixth transistor (M6) the current corresponding to the voltage applied to the second node (N2), for example, the voltage charged into the first capacitor (C1) and the second capacitor (C2).

The second electrode of the fifth transistor (M5) is connected to the second node (N2), and the first electrode is connected to the second electrode of the fourth transistor (M4). In addition, the gate electrode of the fifth transistor (M5) is connected to the $(n-1)^{th}$ scanning line (Sn−1). Such a fifth transistor (M5) turns on to connect the fourth transistor (M4) in a diode form when the scanning signals are supplied to the $(n-1)^{th}$ scanning line (Sn−1).

The first electrode of the sixth transistor (M6) is connected to the second electrode of the fourth transistor (M4), and the second electrode is connected to the anode electrode of the light emitting diode (OLED). In addition, the gate electrode of the sixth transistor (M6) is connected to the $n^{th}$ light-emitting controlling line (En). Such a sixth transistor (M6) turns off when the light-emitting controlling signals are supplied to the $n^{th}$ light-emitting controlling line (En), and turns on when the light-emitting controlling signals are not supplied thereto. Here, the light-emitting controlling signals supplied to the $n^{th}$ light-emitting controlling line (En) are supplied to be overlapped with the scanning signals supplied to the $(n-1)^{th}$ scanning line (Sn−1) and the $n^{th}$ scanning line (Sn). Accordingly, the sixth transistor (M6) turns off when the scanning signal is supplied to the $(n-1)^{th}$ scanning line (Sn−1) and the $n^{th}$ scanning line (Sn) to charge the predetermined voltage into the first capacitor (C1) and second capacitor (C2), and turns on to electrically connect the light emitting diode (OLED) with the fourth transistor (M4) in the other cases. In addition, FIG. 3 shows the transistors (M1 to M6) in PMOS type for convenience of the description, but the present invention is not limited thereto.

In addition, in the pixel 140 shown in FIG. 3, the reference power supply (Vref) does not supply the current to the light emitting diode (OLED). That is, the voltage drop of the reference power supply (Vref) is not a concern because the reference power supply (Vref) does not supply the current to the pixels 140, and therefore the constant voltage values may be maintained regardless of a position of the pixels 140. Here, the voltage value of the reference power supply (Vref) may be set to be identical or different from that of the first power supply (ELVDD).

Figure 4:
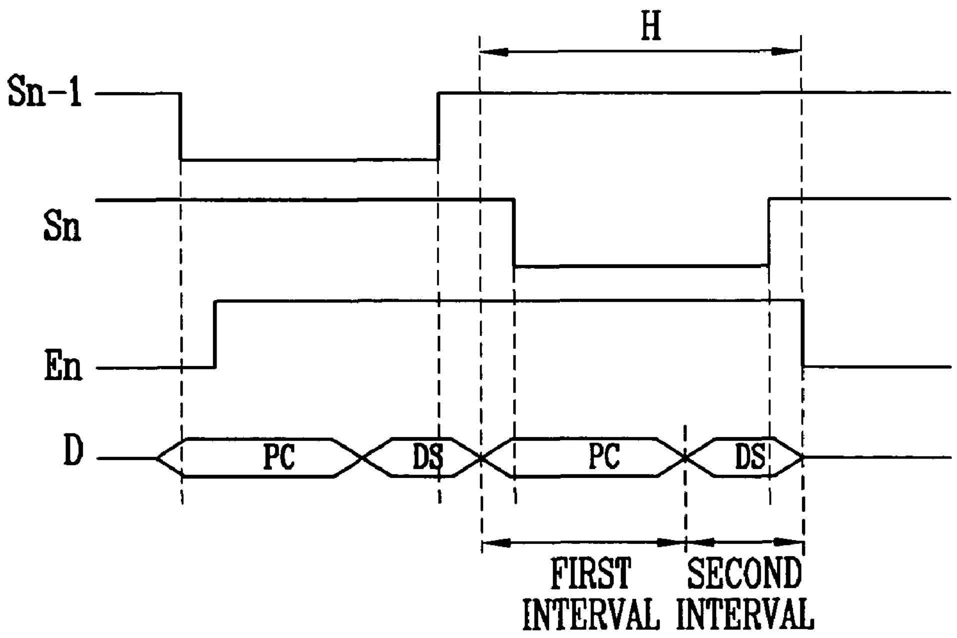
FIG. 4 is a waveform diagram showing a driving method of the pixel shown in FIG. 3.

FIG. 4 is a waveform diagram showing a driving method of the pixel shown in FIG. 3. The first horizontal interval (H) is driven with two intervals, namely a first period and a second period in FIG. 4. The predetermined current (PC) flows in the data lines (D1 to Dm) during the first period, and the data signal (DS) is supplied during the second period. Actually, the predetermined current (PC) is supplied from the pixel 140 to the data driving circuit 200 during the first period (Current Sink), and, the data signal (DS) is supplied from the data driving circuit 200 to the pixel 140 during the second period. Subsequently, it is assumed that the original voltage value of the first reference power supply (Vref) and the original voltage value of the first power supply (ELVDD) are set to be identical to each other for convenience of the description.

An operating process will be described in reference to FIGS. 3 and 4. First, the scanning signal is supplied to the $(n-1)^{th}$ scanning line (Sn−1). The third transistor (M3) and the fifth transistor (M5) turn on if the scanning signal is supplied to the $(n-1)^{th}$ scanning line (Sn−1). The fourth transistor (M4) is connected in a diode form if the fifth transistor (M5) turns on. The voltage value formed by subtracting the threshold voltage of the fourth transistor (M4) from the voltage of first power supply (ELVDD) is applied to the second node (N2) if the fourth transistor (M4) is connected in a diode form.

In addition, the voltage of the reference power supply (Vref) is applied to the first node (N1) if the third transistor (M3) turns on. At this time, the second capacitor (C2) charges the voltage corresponding to the difference between the first node (N1) and the second node (N2). In this case, the voltage corresponding to the threshold voltage of the fourth transistor (M4) is charged to the second capacitor (C2), assuming that the reference power supply (Vref) and the voltage value of the first power supply (ELVDD) are identical to each other. In addition, the threshold voltage of the fourth transistor (M4) and the voltage-dropping of first power supply (ELVDD) are charged to the second capacitor (C2) if the predetermined voltage drop is caused in the first power supply (ELVDD). That is, in the present invention, the voltage drop (or the voltage dropping) of the first power supply (ELVDD) and the threshold voltage of the fourth transistor (M4) are charged to the second capacitor (C2) during an interval when the scanning signals are supplied to the $(n-1)^{th}$ scanning line (Sn−1), and therefore the voltage drop of the first power supply (ELVDD) may be compensated.

The predetermined voltage is charged to the second capacitor (C2), and then the scanning signal is supplied to the $n^{th}$ scanning line (Sn). The first transistor (M1) and the second transistor (M2) turn on if the scanning signal is supplied to the $n^{th}$ scanning line (Sn). The predetermined current (PC) is supplied from the pixel 140 to the data driving circuit 200 via the data line (Dm) during the first period of the first horizontal interval if the second transistor (M2) turns on. Actually, the predetermined current (PC) is supplied to the data driving circuit 200 via the first power supply (ELVDD), the fourth transistor (M4), the second transistor (M2) and the data line (Dm). At this time, the predetermined voltage is charged to the first capacitor (C1) and the second capacitor (C2) to correspond to the predetermined current (PC).

In addition, the data driving circuit 200 resets a current of a gamma voltage unit (not shown) by using the predetermined voltage value (hereinafter, referred to as a compensation voltage) generated when the predetermined current (PC) is sunk, and a voltage of the reset gamma voltage unit is used to generate the data signal (DS). Subsequently, the data signal (DS) is supplied to the first node (N1) via the first transistor (M1) during the second period of the first horizontal interval. Then, the voltage corresponding to difference between the data signal (DS) and the first power supply (ELVDD1) is charged to the first capacitor (C1). At this time, the second capacitor (C2) maintains the voltage charged previously since the second node (N2) is set to a floating state.

That is, in the present invention the voltage drop of the first power supply (ELVDD) and the threshold voltage of the fourth transistor (M4) may be compensated by charging the voltage corresponding to the threshold voltage of the fourth transistor (M4) and the voltage drop of the first power supply (ELVDD) to the second capacitor (C2) during the interval when the scanning signals are supplied to the previous scanning line. In addition, in the present invention, the voltage of the gamma voltage unit is reset to compensate the mobility of the transistors included in the pixels 140 during the interval when the scanning signal is supplied to the current scanning line, and the generated data signal is supplied by using the reset gamma voltage. Accordingly, in the present invention, un-uniformity of the threshold voltage, the mobility, etc., of the transistor may be compensated to display an uniform image. A process of resetting the voltage of the gamma voltage unit will be described later in more detail.

FIG. 5 is a diagram showing another example of the pixel 140 shown in FIG. 2. In FIG. 5 the pixel 140 includes a pixel circuit 142' that is configured in substantially the same manner as in the FIG. 3 except that the first capacitor (C1) is mounted between the second node (N2) and the first power supply (ELVDD).

An operating process will be described in more detail with reference to FIGS. 4 and 5. First, the scanning signal is supplied to the $(n-1)^{th}$ scanning line (Sn−1). The third transistor (M3) and the fifth transistor (M5) turn on if the scanning signal is supplied to the $(n-1)^{th}$ scanning line (Sn−1). The fourth transistor (M4) is connected in a diode form if the fifth transistor (M5) turns on. The voltage value formed by subtracting the threshold voltage of the fourth transistor (M4) from the voltage of the first power supply (ELVDD) is applied to the second node (N2) if the fourth transistor (M4) is connected in a diode form. Accordingly, the voltage corresponding to the threshold voltage of the fourth transistor (M4) is charged to the first capacitor (C1).

In addition, the voltage of the reference power supply (Vref) is applied to the first node (N1) if the third transistor (M3) turns on. Then, the voltage corresponding to the difference between the first node (N1) and the second node (N2) is charged to the second capacitor (C2). At this time, the data signal (DS) is not supplied to the pixel 140 because the first transistor (M1) and the second transistor (M2) turn off during the interval when the scanning signals are supplied to the $(n-1)^{th}$ scanning line (Sn−1).

Subsequently, the scanning signal is supplied to the $n^{th}$ scanning line (Sn) and then the first transistor (M1) and the second transistor (M2) turn on. The predetermined current (PC) is supplied from the pixel 140 to the data driving circuit 200 via the data line (Dm) during the first period of the first horizontal interval if the second transistor (M2) turns on. Actually, the predetermined current (PC) is supplied to the data driving circuit 200 via the first power supply (ELVDD), the fourth transistor (M4), the second transistor (M2) and the data line (Dm). At this time, the predetermined voltage is charged to the first capacitor (C1) and the second capacitor (C2) in response to the predetermined current (PC).

In addition, the data driving circuit 200 resets the voltage of the gamma voltage unit using the compensation voltage applied to correspond to the predetermined current (PC), and generates the data signal (DS) using the voltage of the reset gamma voltage unit. Subsequently, the data signal (DS) is supplied to the first node (N1) during the second period of the first horizontal interval. Then, a predetermined voltage is charged to the first capacitor (C1) and the second capacitor (C2) to correspond to the data signal (DS).

Actually, the voltage of the first node (N1) is lowered (or dropped) from the voltage of the reference power supply (Vref) to the voltage of the data signal (DS) if the data signal (DS) is supplied. At this time, the voltage value of the second node (N2) is also lowered (or dropped) to correspond to the voltage dropping level of the first node (N1) since the second node (N2) is floated. In this case, the voltage value lowered (or dropped) in the second node (N2) is determined by capacitances of the first capacitor (C1) and the second capacitor (C2).

A predetermined voltage is charged to the first capacitor (C1) to correspond to the voltage value of the second node (N2) if the second node (N2) is dropped. Here, the voltage charged to the first capacitor (C1) is determined by the data signal (DS) because the voltage value of the reference power supply (Vref) is a fixed value. In other words, the pixel 140 shown in FIG. 5 may charge the desired voltage regardless of the voltage drop of the first power supply (ELVDD) since the voltage value charged to the capacitors (C1, C2) is determined by the reference power supply (Vref) and the data signal (DS).

In addition, in the present invention, the voltage of the gamma voltage unit is reset to compensate the mobility, etc., of the transistors included in the pixels 140, and the generated data signal is supplied using the reset gamma voltage. Accordingly, in the present invention, the un-uniformity of the threshold voltage, the mobility, etc., of the transistor may be compensated to display a uniform (or even) image.

Figure 6:
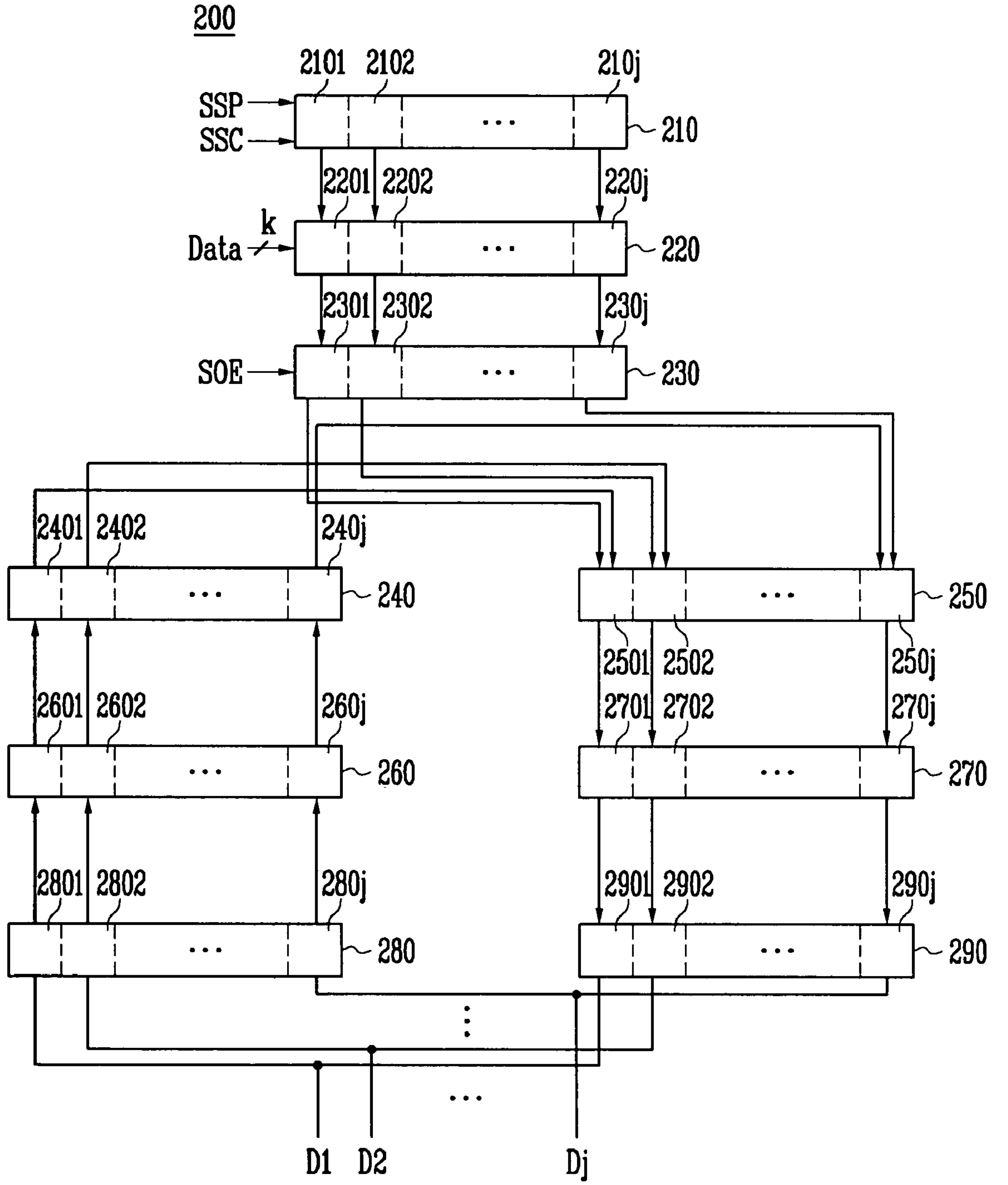
FIG. 6 is a block diagram showing a first embodiment of a data driving circuit shown in FIG. 2.

FIG. 6 is a block diagram showing a first embodiment of the data driving circuit 200 shown in FIG. 2. It is assumed that the data driving circuit 200 has an integral j number of channels (wherein j is at least 2) for convenience of the description.

Referring to FIG. 6, the data driving circuit 200 according to the first embodiment of the present invention includes a shift register unit 210, a sampling latch unit 220, a holding latch unit 230, a gamma voltage unit 240, a digital-analog converting unit 250 (hereinafter, referred to as a DAC unit), a first buffer unit 270, a second buffer unit 260, a current supplying unit 280, and a selecting unit 290.

The shift register unit 210 receives the source shift clock (SSC) and source start pulse (SSP) from the timing controlling unit 150. The shift register unit 210 receiving the source shift clock (SSC) and the source start pulse (SSP) from the timing controlling unit 150 sequentially generates the j number of the sampling signals by shifting the source start pulse (SSP) for every cycle of the source shift clock (SSC). For this purpose, the shift register unit 210 includes the j number of the shift registers **210*l* to 210*j***.

The sampling latch unit 220 sequentially stores data in response to the sampling signals sequentially supplied to the shift register unit 210. Here, the sampling latch unit 220 includes the j number of the sampling latches 2201 to **220*j* to store the j number of the data. In addition, each of the sampling latches 2201 to 220*j* has a size corresponding to bit numbers of the data. For example, each of the sampling latches 2201 to 220*i*** is set to a size of k bits if the data are composed of the k bits.

The holding latch unit 230 receives and stores the data from the sampling latch unit 220 when a source output enable (SOE) signal is input. In addition, the holding latch unit 230 supplies the stored data itself to the DAC unit 250 when the source output enable (SOE) signal is input. Here, the holding latch unit 230 includes the j number of the holding latches 2301 to **230*j* to store the j number of the data. In addition, each of the holding latches 2301 to 230*j* has a size corresponding to the bit numbers of the data. For example, each of the holding latches 2301 to 230*j*** is set to the k bits to store the data.

Figure 8:
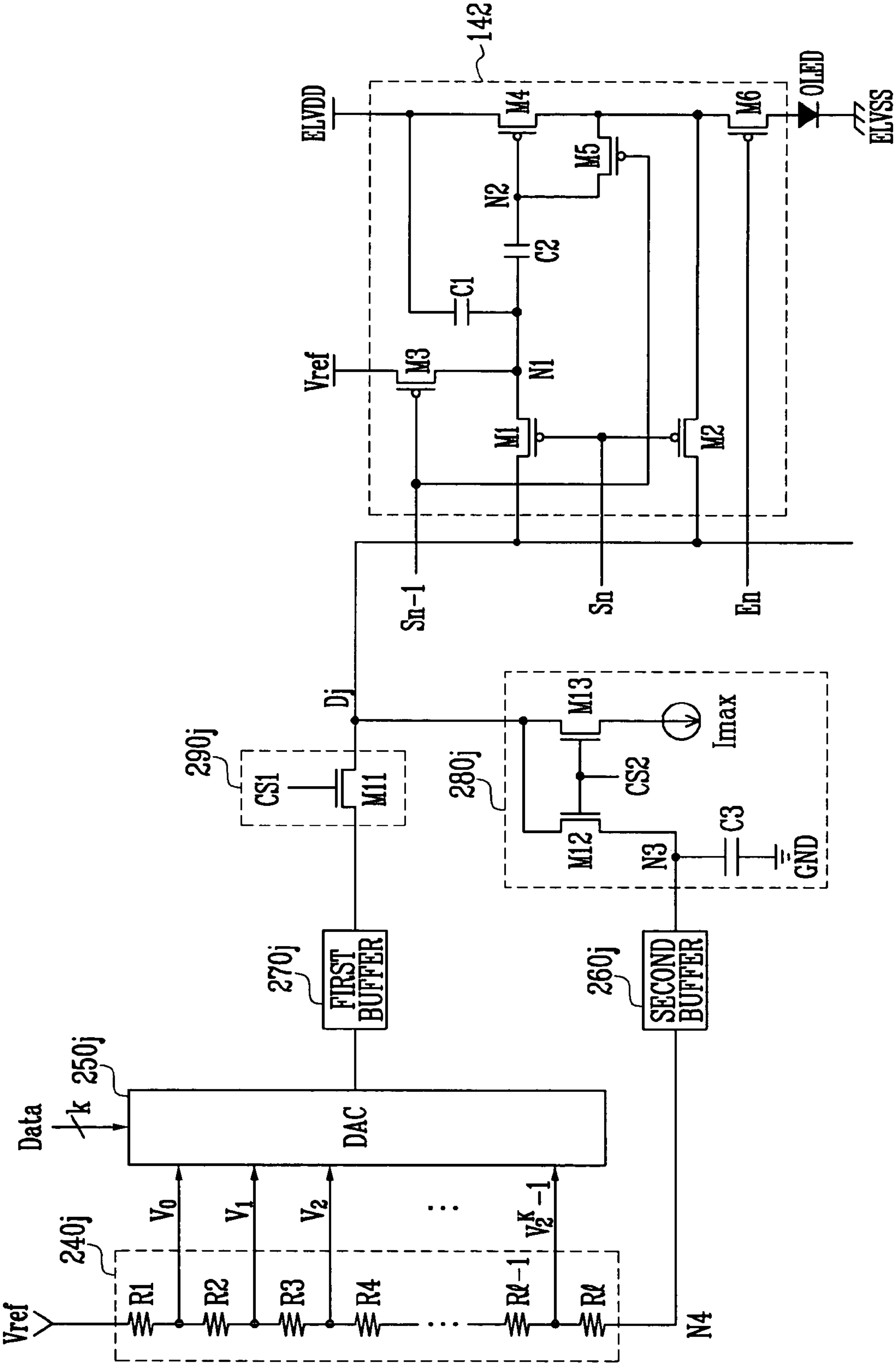
FIG. 8 is a diagram showing an example of connecting correlations of a voltage generating unit, a digital-analog converter, a first buffer, a second buffer, a switching unit, a current sinking unit, and a pixel shown in FIG. 6.

The gamma voltage unit 240 includes the j number of the voltage generating units 2401 to **240*j* for generating the predetermined enhancement voltage to correspond to the k bits of the data. Each of the voltage generating units 2401 to 240*j* is composed of a plurality of partial potential resistances (R1 to Rl) to generate the $2^k$ number of the enhancement voltages, as shown in FIG. 8. Here, each of the voltage generating units 2401 to 240*j* resets the voltage values of the enhancement voltages using the compensation voltage supplied from the second buffer unit 260, and supplies the reset enhancement voltages to the DACs 2501 to 250*j***.

The DAC unit 250 includes the j number of the DAC 2501 to **250*j* for generating the data signal (DS) to correspond to the digital values of the data. Each of the DACs 2501 to 250*j* generates the data signal (DS) by selecting one of a plurality of enhancement voltages to correspond to the digital values of the data supplied from the holding latch unit 230**.

The first buffer unit 270 supplies the data signals (DS) supplied from the DAC unit 250 to the selecting unit 290. For this purpose, the first buffer unit 270 includes the j number of the first buffers 2701 to **270*j***.

The selecting unit 290 controls electrical connections of the data lines (D1 to Dj) with the first buffers 2701 to **270*j*. Actually, the selecting unit 290 electrically connects the first buffers 2701 to 270*j* with the data lines (D1 to Dj) only during the second period of the first horizontal interval, and does not connect the first buffers 2701 to 270***j* with the data lines (D1 to Dj) in the other cases. For this purpose, the selecting unit 290 includes the j number of the switching units 2901 to 290*j*.

The current supplying unit 280 sinks the predetermined current (PC) from the pixels 140 connected with data lines (D1 to Dj) during the first period of the first horizontal interval. Actually, the current supplying unit 280 sinks the current that should be supplied to the light emitting diode (OLED) when the maximum current flows in each of the pixels 140; for example, the pixel 140 is light-emitted with the maximum brightness. In addition, the current supplying unit 280 supplies to the second buffer unit 260 the predetermined compensation voltage generated when the current is sunk. For this purpose, the current supplying unit 280 includes the j number of the current sinking units 2801 to 280*j*.

The second buffer unit 260 supplies to the gamma voltage unit 240 the compensation voltage supplied from the current supplying unit 280. For this purpose, the second buffer unit 260 includes the j number of the second buffers 2601 to 260*j*

Figure 7:
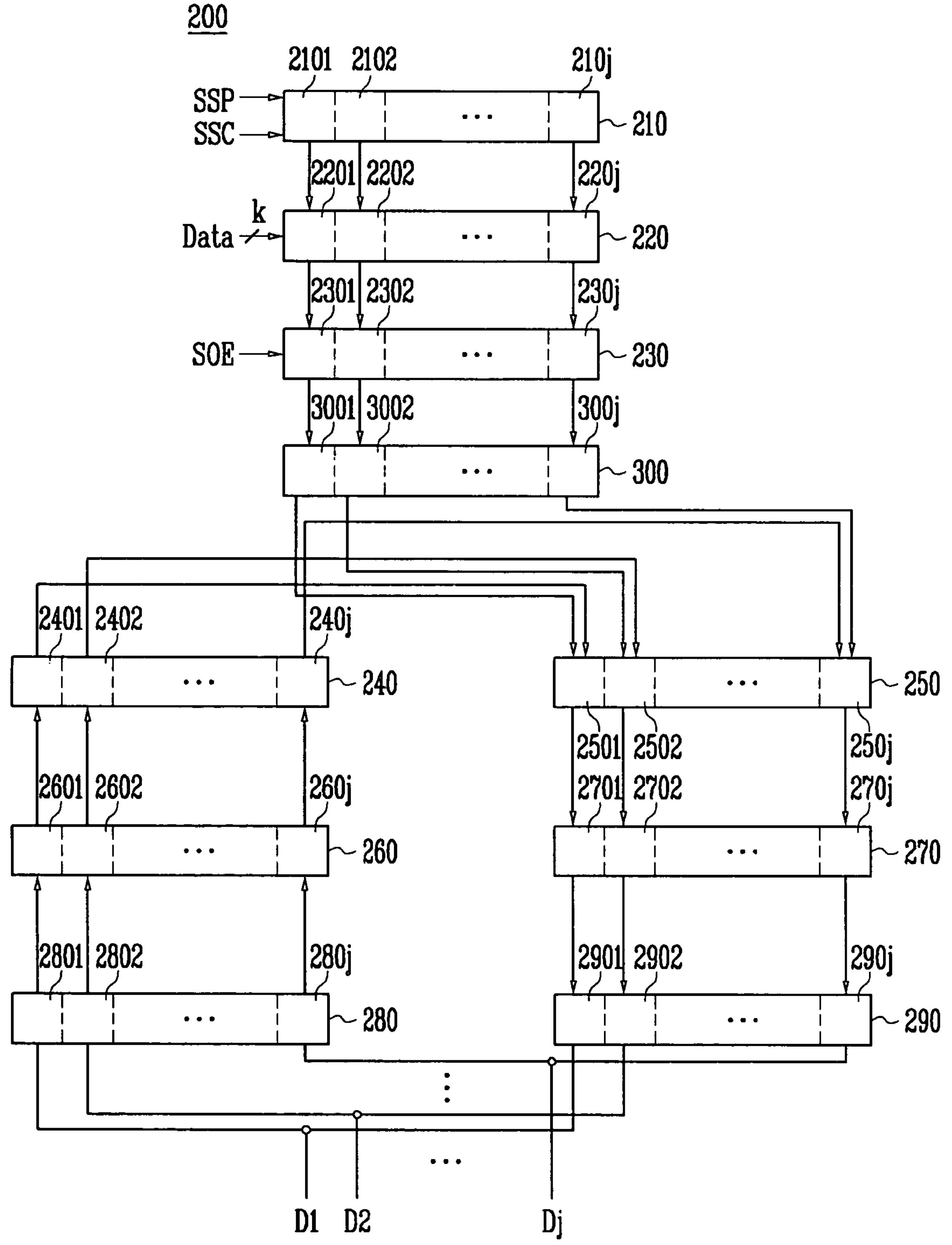
FIG. 7 is a block diagram showing a second embodiment of the data driving circuit shown in FIG. 2.

In addition, the data driving circuit 200 of the present invention further may include a level shifter unit 300 connected to or as a next unit following the holding latch unit 230, as shown in FIG. 7 (second embodiment). The level shifter unit 300 increases a voltage level of the data supplied from the holding latch unit 230 to supply the data to the DAC unit 250. That is, circuit parts having a high internal potential corresponding to the voltage level need to be mounted if the data having a high voltage level is supplied from the external system to the data driving circuit 200, and therefore resulting in an increased manufacturing expense. Accordingly, in FIG. 7, the data having a low voltage level can be supplied from the outside of the data driving circuit 200, and the data having the low voltage level is boosted to the high voltage level in the level shifter unit 300 such that the circuit parts having the high internal potential are not needed.

FIG. 8 is a diagram showing a connecting correlation of a voltage generating unit, a DAC, a first buffer, a second buffer, a switching unit, a current sinking unit, and a pixel mounted on a specific channel. It is assumed that, for convenience of the description, FIG. 8 shows a $j^{th}$ channel, the pixel circuit 142 shown in FIG. 3, and the data line (Dj) connected with the pixel circuit 142 shown in FIG. 3.

Referring to FIG. 8, the voltage generating unit 240*j* includes a plurality of partial potential resistances (R1 to Rl). The partial potential resistances (R1 to Rl) are positioned between the reference power supply (Vref) and the second buffer 260*j* to divide the voltage. Actually, the partial potential resistances (R1 to Rl) generate a plurality of enhancement voltages (V0 to V$2^k$−1) by dividing the voltage between the compensation voltages supplied from the reference power supply (Vref) and the second buffer 260*j*, and supply the generated enhancement voltages (V0 to V$2^k$−1) to the DAC 250*j*.

The DAC 250*j* selects one of the enhancement voltages (V0 to V$2^k$−1) in response to the digital value to the data, and supplies the selected enhancement voltage to the first buffer 270*j*. Here, the enhancement voltage selected in the DAC 250*j* is used as the data signal (DS).

The first buffer 270*j* transfers the data signal (DS) supplied from the DAC 250*j* to the switching unit 290*j*.

Figure 9:
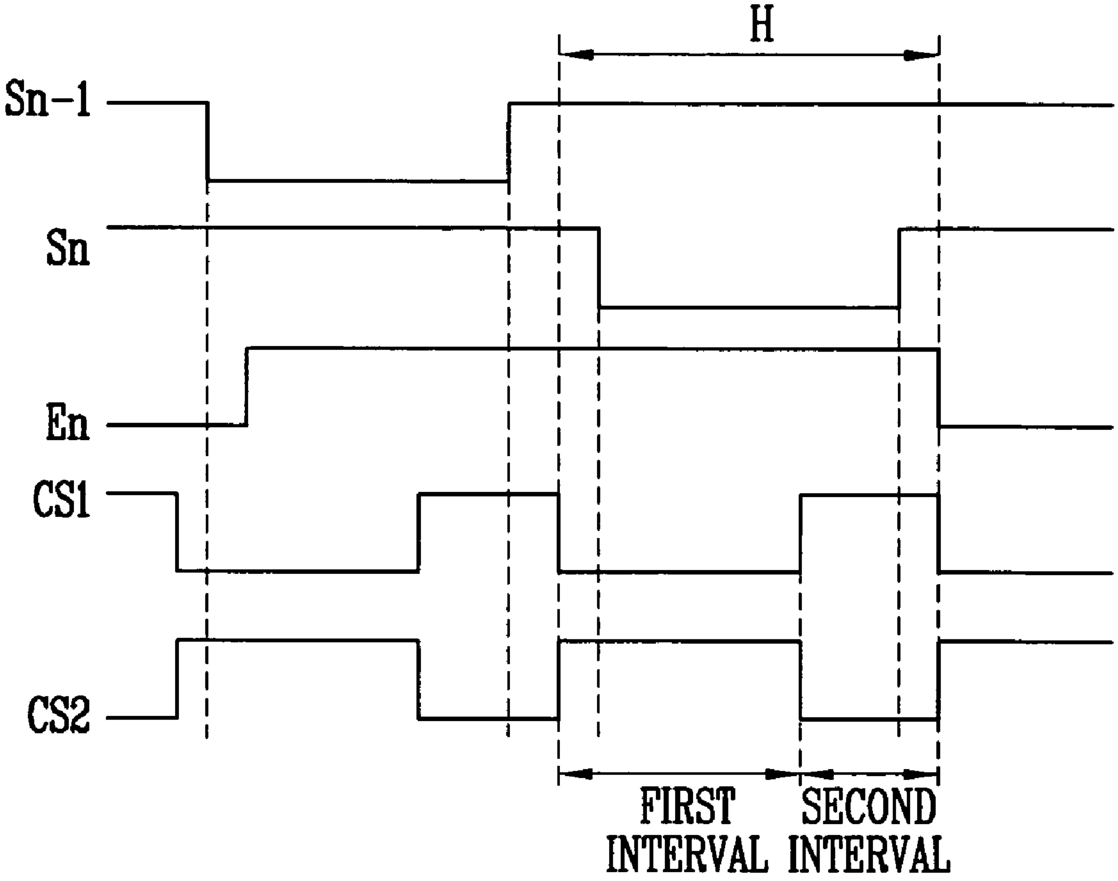
FIG. 9 is a waveform diagram showing a driving method of the pixel, the switching unit, and the current sinking unit shown in FIG. 8.

The switching unit 290*j* includes an eleventh transistor (M11). Such an eleventh transistor (M11) is controlled by a first controlling signal (CS1), as also shown in FIG. 9. That is, the eleventh transistor (M11) turns off during the first period of the first horizontal interval (H) and turns on during the second period. Accordingly, the data signal (DS) is supplied to the data line (Dj) during the second period of the first horizontal interval (H), and is not supplied during the other intervals.

The current sinking unit 280*j* includes a twelfth transistor (M12) and a thirteenth transistor (M13) controlled by the second controlling signal (CS2), a current source (Imax) connected to the first electrode of the thirteenth transistor (M13), and a third capacitor (C3) connected between a third node (N3) and a ground voltage source.

The gate electrode of the twelfth transistor (M12) is connected to the gate electrode of the thirteenth transistor (M13), and the second electrode is connected with the second electrode and the data line (Dj) of the thirteenth transistor (M13). In addition, the first electrode of the twelfth transistor (M12) is connected to the second buffer 260*j*. Such a twelfth transistor (M12) turns on during the first period of the first horizontal interval (H) and turns off during the second period by the second controlling signal (CS2), respectively.

The gate electrode of the thirteenth transistor (M13) is connected to the gate electrode of the twelfth transistor (M12), and the second electrode is connected to the data line (Dj). In addition, the first electrode of the thirteenth transistor (M13) is connected to the current source (Imax). Such a thirteenth transistor (M13) turns on during the first period of the first horizontal interval (H) and turns off during the second period by the second controlling signal (CS2), respectively.

The current source (Imax) receives the current that should be supplied to the organic light emitting diode (OLED) from the pixel circuit 142 during the first period when the twelfth transistor (M12) and the thirteenth transistor (M13) turn on if the pixel 140 is to be light emitted with the maximum brightness.

The third capacitor (C3) stores the compensation voltage applied to the third node (N3) when the current is sunk from the pixel 140 by the current source (Imax). Actually, the third capacitor (C3) charges the compensation voltage applied to the third node (N3) during the first period, and maintains the constant compensation voltage of the third node (N3) even though the twelfth transistor (M12) and the thirteenth transistor (M13) turn off.

The second buffer 260*j* supplies the compensation voltage applied to the third node (N3), for example, the current charged to the third capacitor (C3) to voltage generating unit 240*j*. Then, the voltage generating unit 240*j* divides the currents between the compensation voltages supplied from the reference power supply (Vref) and the second buffer 260*j*. Here, the compensation voltages applied to the third node (N3) are identically or differently set in every pixel 140 by the mobility, etc., of the transistors included in the pixels 140. Actually, the compensation voltages supplied to each of the j number of the voltage generating units 2401 to 240*j* are determined by the currently connected pixel 140.

In addition, the voltage values of the enhancement voltages (V0 to V$2^k$−1) supplied to the DACs 2501 to 250*j* mounted in every j number of the channels are set to different values if the different compensation voltages are supplied to the j number of the voltage generating units 2401 to 240*j*. Here, the enhancement voltages (V0 to V$2^k$−1) may display the uniform images in the display region 130 even though the mobility, etc., of the transistors included in the pixel 140 are ununiform since each of the data lines (D1 to Dj) is controlled by the currently connected pixel 140.

FIG. 9 shows a waveform diagram of a driving method supplied to the switching unit 290*i*, the current sinking unit 280*i*, and the pixel circuit 142 shown in FIG. 8.

The voltage values of the data signal (DS) supplied to the pixel 140 will be described in more detail with reference to FIGS. 8 and 9. First, the scanning signal is supplied to the $(n-1)^{th}$ scanning line (Sn−1). The third transistor (M3) and the fifth transistor (M5) turn on if the scanning signals are supplied to the $(n-1)^{th}$ scanning line (Sn−1). Then, the voltage value formed by subtracting the threshold voltage of the fourth transistor (M4) from the voltage of the first power supply (ELVDD) is applied to the second node (N2), and the voltage of the reference power supply (Vref) is applied the first node (N1). At this time, the voltages corresponding to the voltage drop (or the voltage-dropping) of the first power supply (ELVDD) and the threshold voltage of the fourth transistor (M4) are charged to the second capacitor (C2).

Actually, the voltage applied to each of the first node (N1) and the second node (N2) may be respectively presented as Equations 1 and 2, as follows.

$$V_{N1}=Vref\; V_{N2}=ELVDD-|V_{thM4}| \quad \text{Equations 1 and 2}$$

In the Equations 1 and 2, $V_{N1}$ represents a voltage applied to the first node (N1), $V_{N2}$ represents a voltage applied to the second node (N2), and $V_{thM4}$ represents a threshold voltage of the fourth transistor (M4).

In addition, the first node (N1) and the second node (N2) are set to a floating state during the interval between a point when the scanning signal supplied to the $(n-1)^{th}$ scanning line (Sn−1) turns off and a point when the scanning signal is supplied to the $n^{th}$ scanning line (Sn). Accordingly, the voltage value charged to the second capacitor (C2) is not varied.

Subsequently, the scanning signal is supplied to the $n^{th}$ scanning line (Sn) and then the first transistor (M1) and the second transistor (M2) turn on. In addition, the twelfth transistor (M12) and the thirteenth transistor (M13) turn on during the first period of the interval when the scanning signal is supplied to the $n^{th}$ scanning line (Sn). The current corresponding to the current source (Imax) is sunk via the first power supply (ELVDD), the fourth transistor (M4), the second transistor (M2), the data line (Dj), and the thirteenth transistor (M13) if the twelfth transistor (M12) and the thirteenth transistor (M13) turn on.

At this time, the current of the current source (Imax) may be presented as Equation 3 since it flows in the fourth transistor (M4).

$$Imax = \frac{1}{2}\mu_p C_{ox}\frac{W}{L}(ELVDD - V_{N2} - |V_{thM4}|)^2 \quad \text{Equation 3}$$

In the Equation 3, μ represents mobility, $C_{ox}$ represents a volume of an oxide layer, W represents a channel width, and L represents a channel length.

The voltage applied to the second node (N2) may be presented as Equation 4 when a current as in the Equation 3 flows in the fourth transistor (M4).

$$V_{N2} = ELVDD - \sqrt{\frac{2Imax}{\mu_p C_{ox}}\frac{L}{W}} - |V_{thM4}| \quad \text{Equation 4}$$

In addition, the voltage, which is applied to the first node (N1) by coupling the second capacitor (C2), may be presented as Equation 5.

$$V_{N1} = Vref - \sqrt{\frac{2Imax}{\mu_p C_{ox}}\frac{L}{W}} = V_{N3} = V_{N4} \quad \text{Equation 5}$$

In one embodiment, the voltage ($V_{N1}$) applied to the first node (N1) is set to be identical to the voltage ($V_{N3}$) applied to the third node (N3) and the voltage ($V_{N4}$) applied to the fourth node (N4). That is, a voltage as in the Equation 5 is applied to the fourth node (N4) when the current is sunk by the current source (Imax).

Also, the voltages applied to the third node (N3) and the fourth node (N4) are subject to influence of mobility, etc., of one or more of the transistors included in the pixel 140 in which the current is currently sunk, as presented in the Equation 5. Accordingly, the voltage values applied to the third node (N3) and the fourth node (N4) may be different in every pixel 140 when the current is sunk by the current source (Imax) (the mobility are different).

In addition, the voltage ($V_{diff}$) of the voltage generating unit 240*j* may be presented as Equation 6 when the voltage realized by the Equation 5 is applied to the fourth node (N4).

$$V_{diff} = Vref - \left(Vref - \sqrt{\frac{2Imax}{\mu_p C_{ox}}\frac{L}{W}}\right) \quad \text{Equation 6}$$

In addition, the voltage (Vb) supplied to the first buffer 270*j* may be presented as Equation 7 if an $h^{th}$ (h is a lower integral number than an integral number f) enhancement voltage of the f number (f is an integral number) of the enhancement voltages is selected to correspond to the data in the DAC 250*j*.

$$Vb = Vref - \frac{h}{f}\sqrt{\frac{2Imax}{\mu_p C_{ox}}\frac{L}{W}} \quad \text{Equation 7}$$

Also, the current is sunk during the first period to charge the voltage as shown in the Equation 5 to the third capacitor (C3), and then the twelfth transistor (M12) and the thirteenth transistor (M13) turn off, and the eleventh transistor (M11) turns on during the second period. At this time, the third capacitor (C3) maintains the voltage value charged to itself. Accordingly, the voltage value of the third node (N3) may be maintained as in the Equation 5.

In addition, the voltage supplied to the first buffer 270*j* is supplied to the first node (N1) via the eleventh transistor (M11), the data line (Dj) and the first transistor (M1) since the eleventh transistor (M11) turns on during the second period. That is, a voltage as in the Equation 7 is supplied to the first node (N1). In addition, the voltage, which is applied to the second node (N2) by coupling the second capacitor (C2) may be presented as Equation 8.

$$V_{N2} = ELVDD - \frac{h}{f}\sqrt{\frac{2Imax}{\mu_p C_{ox}}\frac{L}{W}} - |V_{thM4}| \quad \text{Equation 8}$$

At this time, the current flowing via the fourth transistor (M4) may be presented as Equation 9.

$$I_{N4} = \frac{1}{2}\mu_p C_{OX}\frac{W}{L}(ELVDD - V_{N2} - |V_{thM4}|)^2 = \frac{1}{2}\mu_p C_{OX}\frac{W}{L}\left(ELVDD - \left(\begin{matrix} ELVDD - \\ \frac{h}{f}\sqrt{\frac{2Imax}{\mu_p C_{OX}}\frac{L}{W}} - \\ |V_{thM4}| \end{matrix}\right) - V_{thM4}\right)^2 = \left(\frac{h}{f}\right)^2 Imax \quad \text{Equation 9}$$

Referring to Equation 9, in the present invention the current flowing in the fourth transistor (M4) is determined by the enhancement voltage generated in the voltage generating unit 240*j*. That is, in the present invention the current determined by the enhancement voltage may flow into the fourth transistor (M4) regardless of the threshold voltage, the mobility, etc., of the fourth transistor (M4), and therefore a uniform image may be displayed.

Figure 10:
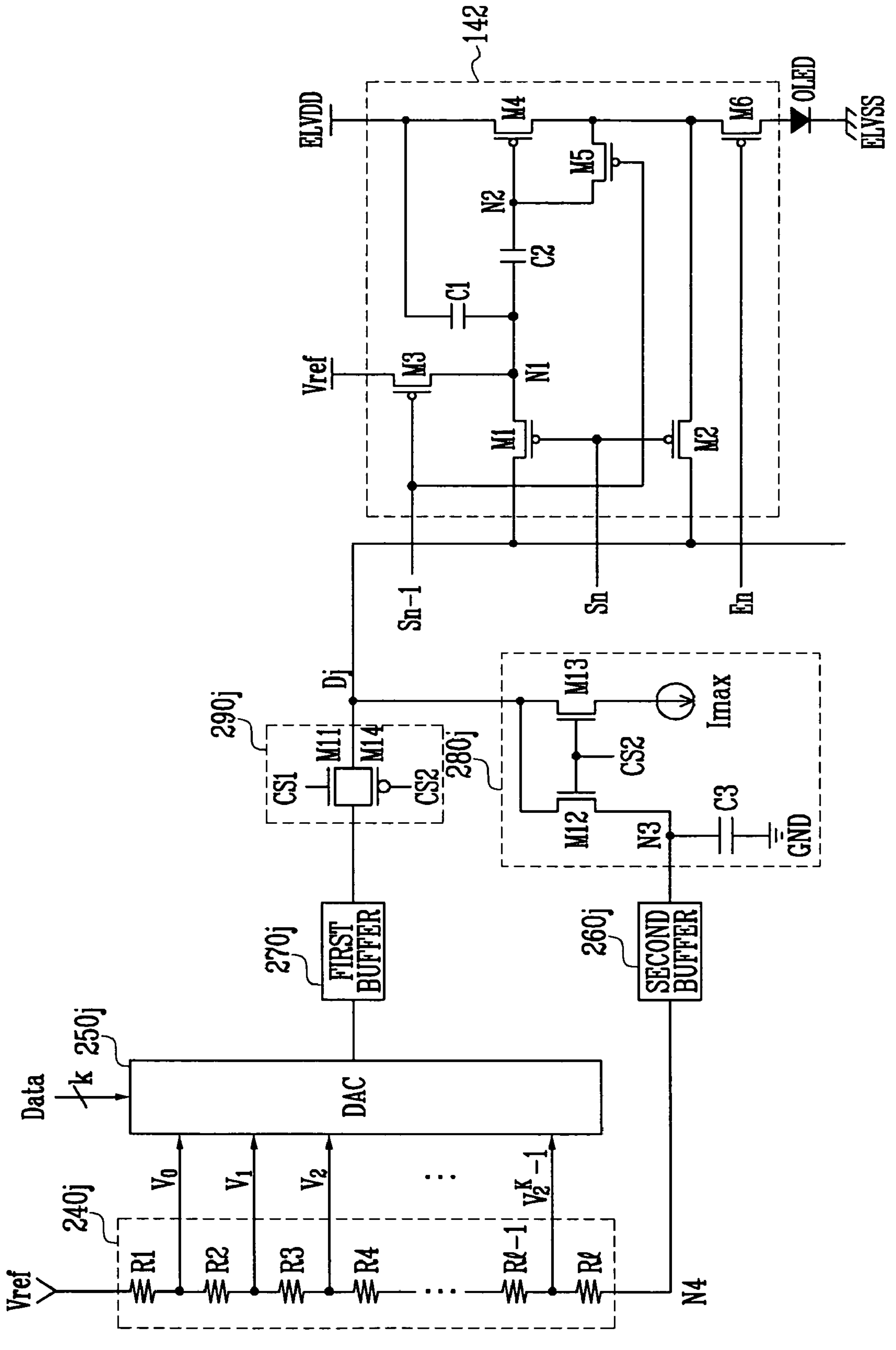
FIG. 10 is a diagram showing another example of the switching unit shown in FIG. 8.

Also, the switching unit 290*j* may be variously configured in the present invention. For example, the switching unit 290*j* may allow the eleventh transistor (M11) and a fourteenth transistor (M14) to be connected in a transmission gate form, as shown in FIG. 10. The fourteenth transistor (M14) is formed as a PMOS type transistor, and receives the second controlling signal (CS2). The eleventh transistor (M11) is formed as an NMOS type transistor, and receives the first controlling signal (CS1). Here, the eleventh transistor (M11) and the fourteenth transistor (M14) turn on and turn off at the same time since the first controlling signal (CS1) and the second controlling signal (CS2) have opposite polarities.

In addition, a switching error may be minimized if the eleventh transistor (M11) and the fourteenth transistor (M14) are connected in the transmission gate form because a voltage-current characteristic curve is set to have a roughly straight line.

Figure 11:
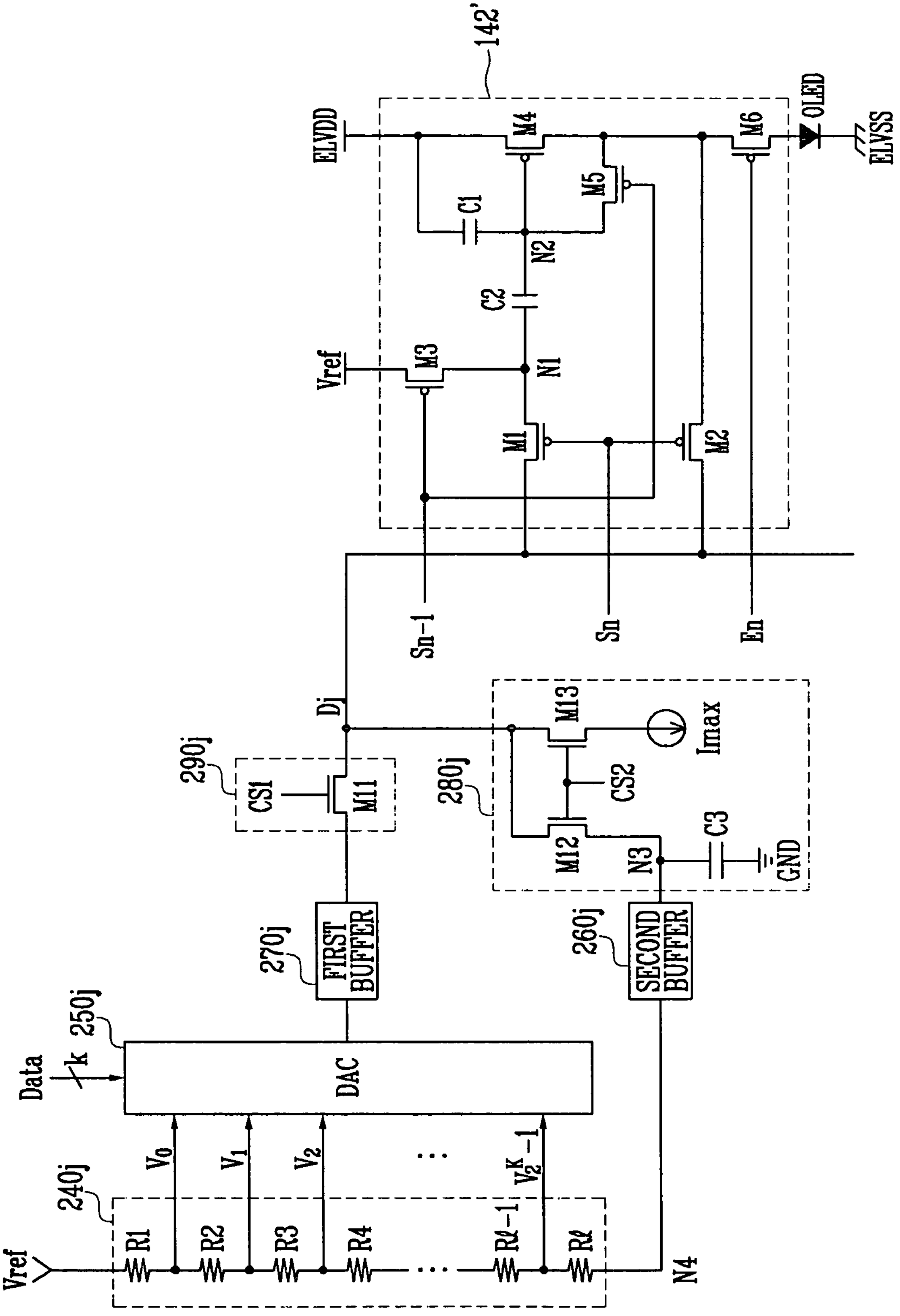
FIG. 11 is a diagram showing another example of connecting correlations of the voltage generating unit, the digital-analog converter, the first buffer, the second buffer, the switching unit, the current sinking unit, and the pixel shown in FIG. 6.

FIG. 11 is another example showing connecting correlations of the voltage generating unit, the DAC, the first buffer, the second buffer, the switching unit, the current sinking unit and the pixel which are mounted on a specific channel. In FIG. 11, a configuration is set to be substantially identical to that of FIG. 8 except that the pixel circuit 142' connected to the data line (Dj) is different. Accordingly, the voltage supplied to the pixel circuit 142' will be described further in more detail.

Referring to FIGS. 9 and 11, the voltage as described in the Equations 1 and 2 are respectively applied to the first node (N1) and the second node (N2) when the scanning signal is supplied to the $(n-1)^{th}$ scanning line (Sn−1).

In addition, when the scanning signal is supplied to the $n^{th}$ scanning line (Sn), the current, which flows into the fourth transistor (M4) during the first period when the twelfth transistor (M12) and the thirteenth transistor (M13) turn on, is presented as Equation 3, and the voltage applied to the second node (N2) is presented as Equation 4.

In addition, the voltage, which is applied to the first node (N1) by coupling the second capacitor (C2), may be presented as Equation 10.

$$V_{N1} = Vref - \left(\frac{C1 + C2}{C2}\right)\sqrt{\frac{2Imax}{\mu_p C_{ox}}\frac{L}{W}} = V_{N3} = V_{N4} \quad \text{Equation 10}$$

In addition, a voltage ($V_{diff}$) of the voltage generating unit 240*j* may be presented as Equation 11 because the voltage applied to the first node (N1) is supplied to the third node (N3) and the fourth node (N4).

$$V_{diff} = Vref - \left(Vref - \left(\frac{C1 + C2}{C2}\right)\sqrt{\frac{2Imax}{\mu_p C_{OX}}\frac{L}{W}}\right) \quad \text{Equation 11}$$

In addition, a voltage (Vb) supplied to the first buffer 270*j* may be presented as Equation 12 if an $h^{th}$ enhancement voltage in the f number of the enhancement voltages is selected in the DAC 250*j*.

$$Vb = Vref - \frac{h}{f}\left(\frac{C1 + C2}{C2}\right)\sqrt{\frac{2Imax}{\mu_p C_{OX}}\frac{L}{W}} \quad \text{Equation 12}$$

The voltage supplied to the first buffer 270*j* is supplied to the first node (N1). At this time, the voltage applied to the second node (N2) may be presented as Equation 8. Accordingly, the current, which flows via the fourth transistor (M4), may be presented as Equation 9. That is, in the present invention the current, which is supplied to the light emitting diode (OLED) via the fourth transistor (M4), may display a uniform image because it is determined by the enhancement voltage regardless of the threshold voltage, the mobility, etc., of the fourth transistor (M4).

Also, as shown in FIG. 5, although the voltage of the first node (N1) is highly varied in the pixel circuit 142', the voltage of the second node (N2) is slightly varied (namely, C1+C2/C2). Accordingly, if the pixel circuit 142' as shown in FIG. 5 is applied, the voltage generating unit 240*j* may be set to have a wider voltage range than that of the pixel circuit 142 as shown in FIG. 3. As described above, it may be useful to reduce the influence by the switching errors of the eleventh transistor (M11), the first transistor (M1), etc., if the voltage of the voltage generating unit 240*j* is set to a wide range.

Also, the above-mentioned description of FIGS. 8 and 11 is an ideal case that does not take into account the loading of the data line (Dj). Actually, the voltage values applied to the first node (N1) and the third node (N3) are differently set by the voltage dropping of the data line (Dj) when the predetermined current (PC) is sunk. That is, the voltage value of the third node (N3) is set to be lower than that of the first node (N1) by the voltage dropping of the data line (Dj) when the predetermined current (PC) is sunk, and therefore the desired enhanced image may be displayed. In an enhancement of the above described embodiments, a data driving circuit as shown in the FIG. 12 is provided to take into account of the loading of the data line (Dj).

Figure 12:
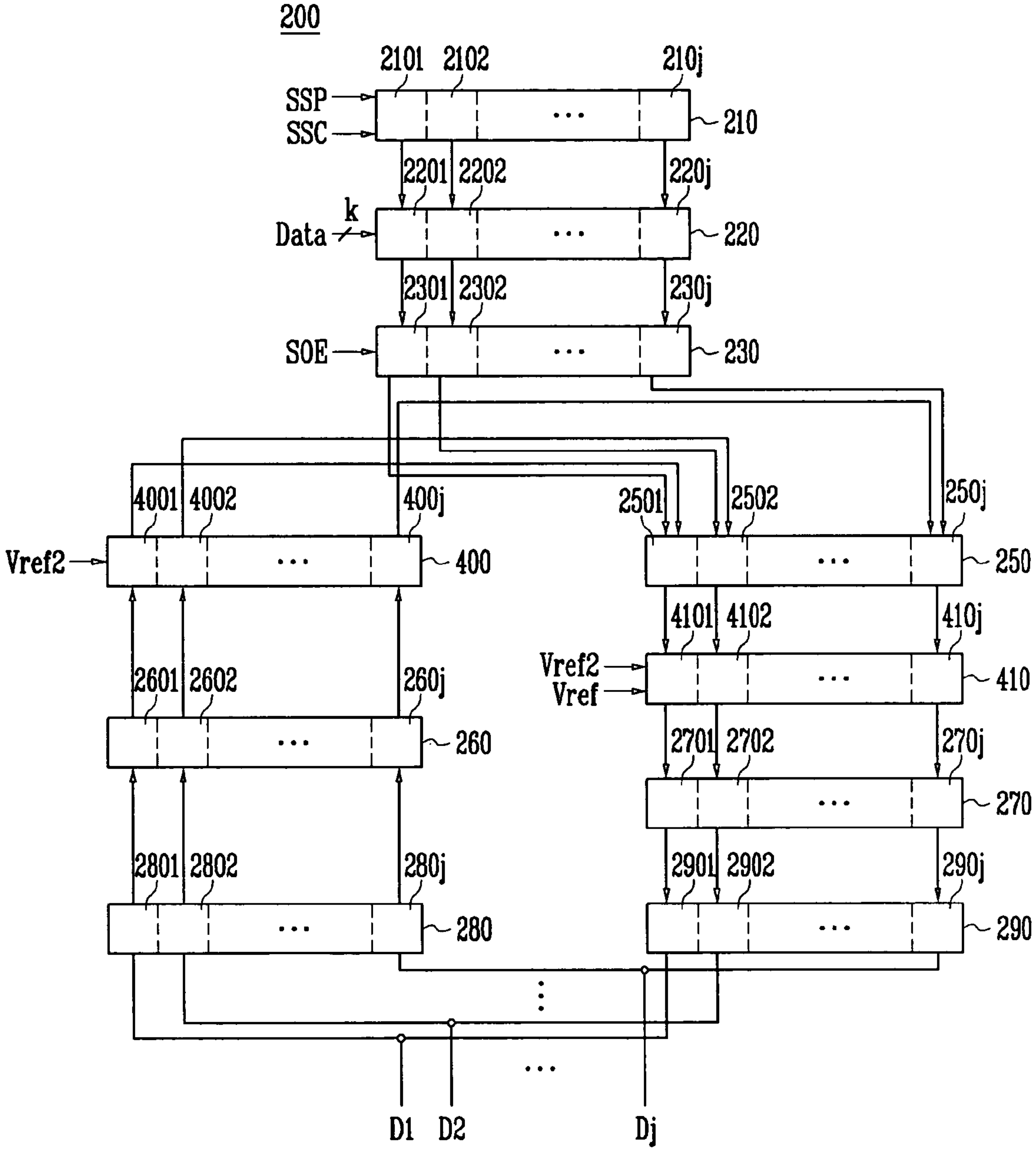
FIG. 12 is a block diagram showing a third embodiment of the data driving circuit shown in FIG. 2.

FIG. 12 is a block diagram showing a third embodiment of the data driving circuit 200 as shown in FIG. 2. In FIG. 12, elements that have the same reference numerals as in FIG. 6 are configured substantially the same, and therefore their detailed descriptions are omitted.

Referring to FIG. 12, the data driving circuit 200 according to the third embodiment of the present invention includes the shift register unit 210, the sampling latch unit 220, the holding latch unit 230, the DAC unit 250, the first buffer unit 270, the second buffer unit 260, the current supplying unit 280, the selecting unit 290, a gamma voltage unit 400, and a boosting block 410.

Figure 14:
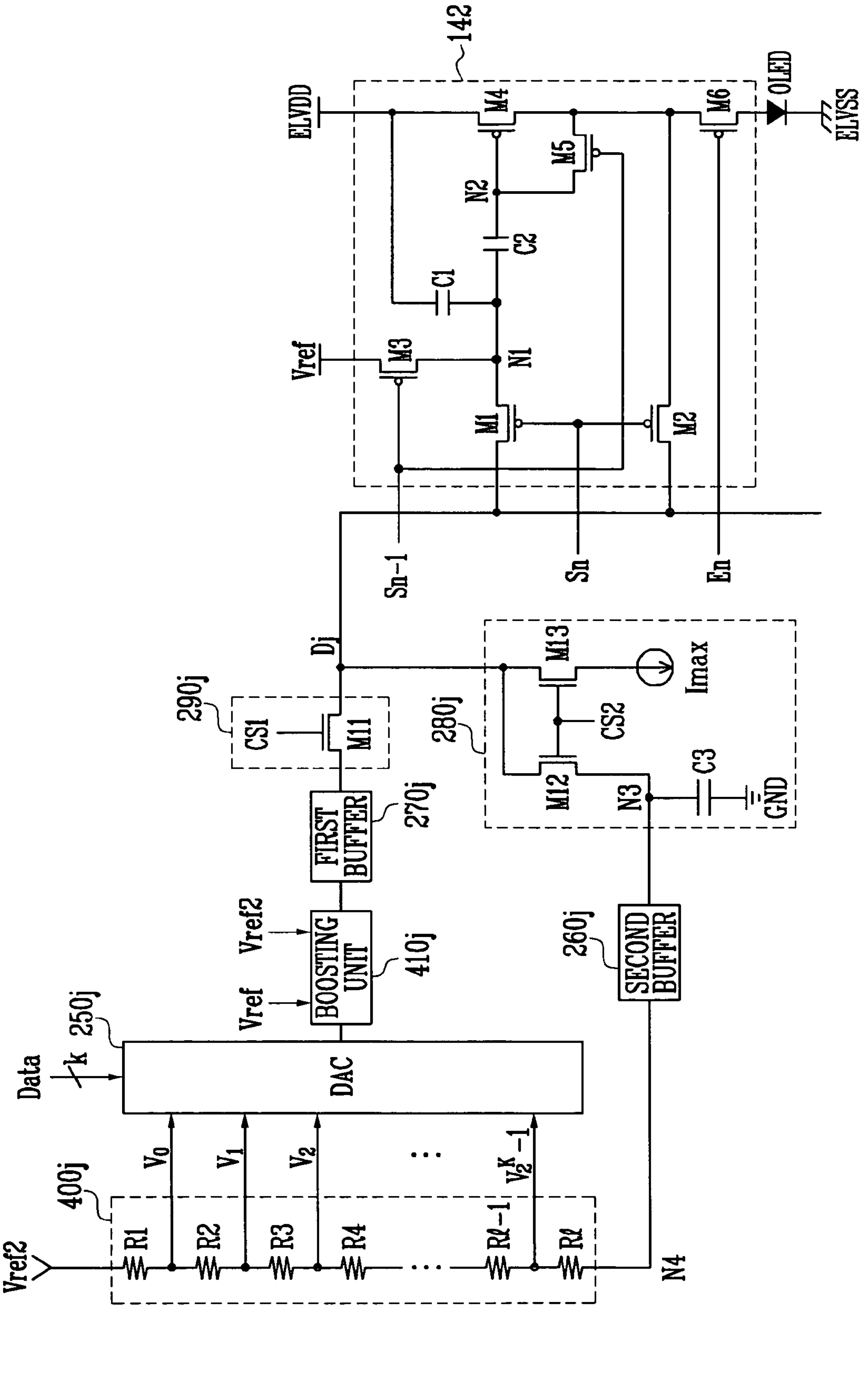
FIG. 14 is a diagram showing an example of connecting correlations of a voltage generating unit, a digital-analog converter, a boosting unit, a first buffer, a second buffer, a switching unit, a current sinking unit, and a pixel shown in FIG. 12.
Figure 15:
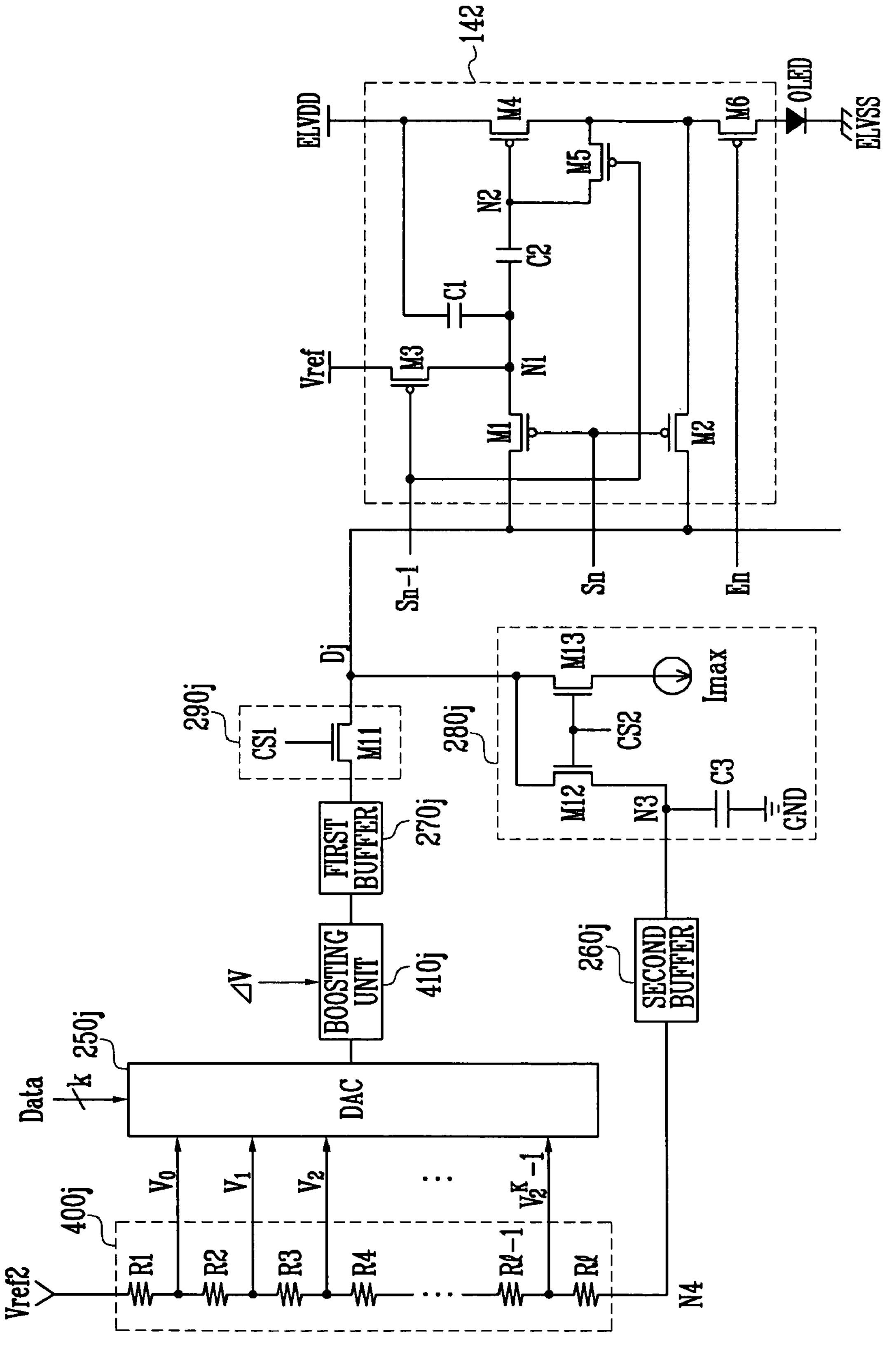
FIG. 15 is a diagram showing another example of connecting correlations of the voltage generating unit, the digital-analog converter, the boosting unit, the first buffer, the second buffer, the switching unit, the current sinking unit, and the pixel shown in FIG. 12.

The gamma voltage unit 400 includes j number of voltage generating units 4001 to 400*j* for generating a predetermined enhancement voltage to correspond to k bits of the data. Each of the voltage generating units 4001 to 400_j_ is composed of a plurality of partial potential resistances (R1 to Rl) to generate the $2^k$ number of enhancement voltages, as shown in FIG. 14. Actually, the partial potential resistances (R1 to Rl) generate enhancement voltages by dividing the voltage of a second reference power supply (Vref2) and the compensation voltages supplied from the second buffer unit 260, and supply the generated enhancement voltages to the DACs 2501 to 250_j_. Here, the voltage of the second reference power supply (Vref2) is set by subtracting from the voltage of a first reference power supply (Vref) a voltage-dropping voltage (ΔV) caused when the current is sunk in the current supplying unit 280 (namely, Vref2=Vref−ΔV).

The boosting block 410 includes the j number of boosting units 4101 to 410_j_ mounted between the DAC unit 250 and the first buffer unit 270. Each of the boosting units 4101 to 410_j_ receives the enhancement voltages from each of the DACs 2501 to 250_j_. Each of the boosting units 4101 to 410_j_ receiving the enhancement voltages boosts the voltage (ΔV) corresponding to the difference between the voltage of the first reference power supply (Vref) and the voltage of the second reference power supply (Vref2). That is, each of the boosting units 4101 to 410_j_ boosts voltages of the enhancement voltages as much as the voltage-dropping voltage (ΔV) of the data line so as to display the desired image in the pixels 140.

Figure 13:
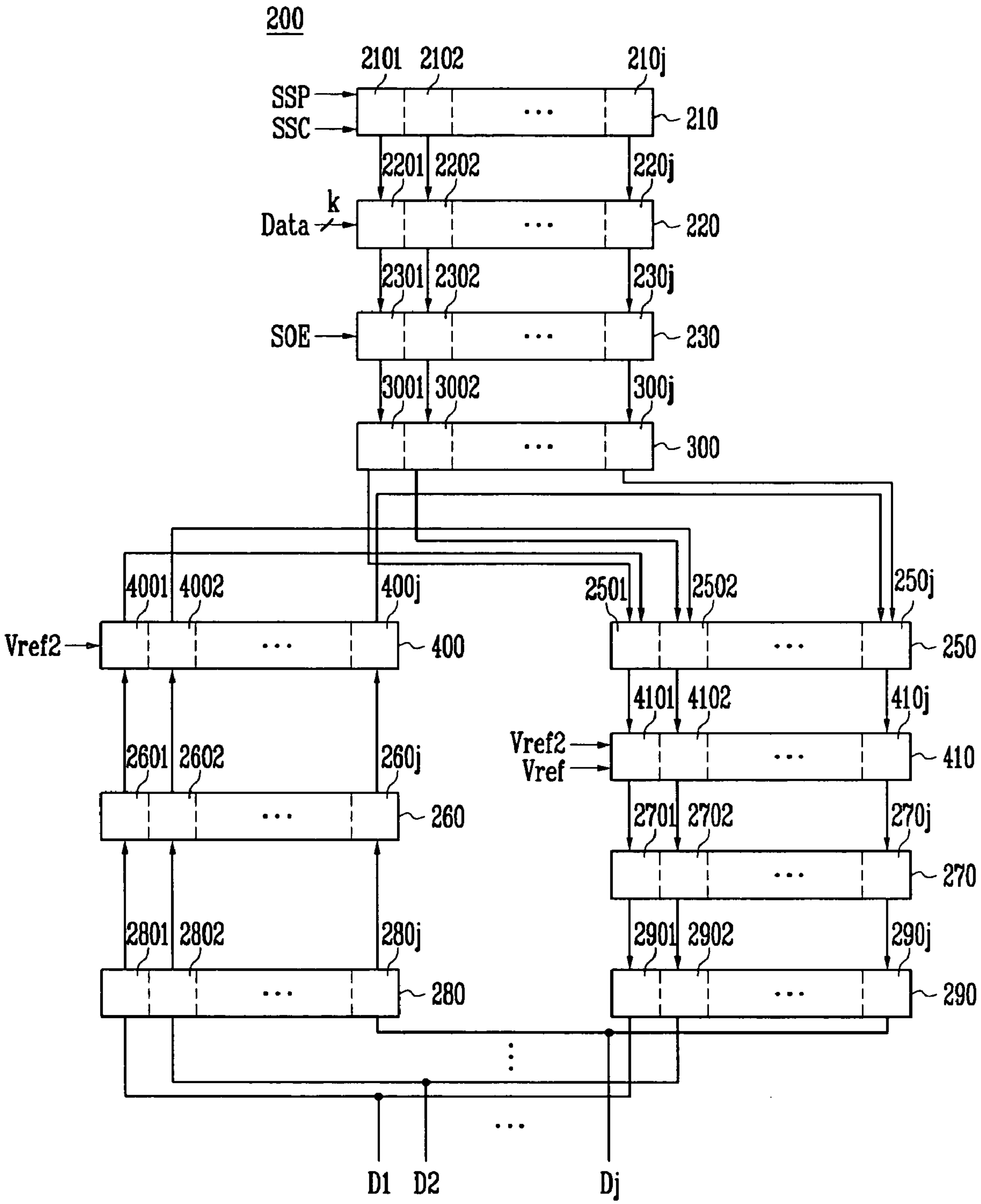
FIG. 13 is a block diagram showing a fourth embodiment of the data driving circuit shown in FIG. 2.

In addition, the data driving circuit 200 of the present invention may include a level shifter unit 300 connected to (or as a next unit following) the holding latch unit 230, as shown in FIG. 13 (fourth embodiment). The level shifter unit 300 increases a voltage level of the data supplied from the holding latch unit 230 to supply the data to the DAC unit 250. That is, circuit parts having a high internal potential corresponding to the high voltage level need to be mounted if the data having a high voltage level is supplied from the external system to the data driving circuit 200, and therefore resulting in an increased manufacturing expense. Accordingly, in FIG. 13, the data having a low voltage level can be supplied from the outside of the data driving circuit 200, and the data having such a low voltage level is boosted to a high voltage level in the level shifter unit 300 such that the circuit parts having the high internal potential are not needed.

FIG. 14 is a diagram showing connecting correlations of a voltage generating unit, a DAC, boosting unit, a first buffer, a second buffer, a switching unit, a current sinking unit, and a pixel mounted on a specific channel. It is assumed that FIG. 14 shows a $j^{th}$ channel, and that the data line (Dj), for convenience of the description, is connected with the pixel circuit 142 shown in FIG. 3. Here, although the pixel circuit 142' shown in FIG. 5 is also connected to the data line (Dj), a description of an operating process in which the pixel circuit 142' of FIG. 5 is connected to the data line (Dj) is omitted since the boosting unit 410_j_ and the voltage generating unit 400_j_ have substantially the same operating processes as will be described for the pixel 142 of FIG. 3.

Referring to FIG. 14, the voltage generating unit 400_j_ includes a plurality of partial potential resistances (R1 to Rl). The partial potential resistances (R1 to Rl) are positioned between the second reference power supply (Vref2) and the second buffer 260_j_ to divide the voltages. Actually, the partial potential resistances (R1 to Rl) divide the voltages between the compensation voltages supplied from the second reference power supply (Vref2) and the second buffer 260_j_ to generate a plurality of enhancement voltages (V0 to $V2^k-1$), and supply the generated enhancement voltages (V0 to $V2^k-1$) to the DAC 250_j_.

Here, the voltage values of the second reference power supply (Vref2) are differently set depending on a position of the currently connected pixel 140. Actually, the voltage-dropping voltage (ΔV) which is generated in the pixel 140 connected with the first scanning line (S1) and voltage-dropping voltage (ΔV) which is generated in the pixel 140 connected with the $n^{th}$ scanning line (Sn) are set to correspond to each other.

The DAC 250_j_ selects one of the enhancement voltages (V0 to $V2^k-1$) in response to digital values of the data, and supplies the selected enhancement voltage to the first buffer 270_j_. Here, the enhancement voltage selected in the DAC 250_j_ is used as a data signal (DS).

The boosting unit 410_j_ generates a voltage-dropping voltage (ΔV) by subtracting the voltage value of the second reference power supply (Vref2) from the voltage value of the first reference power supply (Vref), and boosts the voltage of the data signal (DS) as much as the voltage-dropping voltage (ΔV). Then, the image of the desired brightness may be displayed in the display region 140.

Operating processes of the voltage generating unit 400_j_ and the boosting unit 410_j_ are described in more detail in relation to FIGS. 9 and 14, and the other suitable configurations are described in brief. First, a voltage as in the Equations 1 and 2 are respectively applied to the first node (N1) and the second node (N2) when the scanning signal is supplied to the $(n-1)^{th}$ scanning line (Sn−1).

Subsequently, a voltage value as in the Equation 5 is applied to the first node (N1) to correspond to the current value which is sunk by the current source (Imax) during the first period of the interval when the scanning signal is supplied to the $n^{th}$ scanning line (Sn). In addition, a voltage as in the Equation 13 is applied to the third node (N3) by loading of the data line (Dj).

$$V_{N3} = Vref - \sqrt{\frac{2Imax}{\mu_p C_{ox}}\frac{L}{W}} - \Delta V = V_{N4} \quad \text{Equation 13}$$

That is, a voltage value formed by subtracting the voltage-dropping voltage (ΔV) via the data line (Dj) from the voltage value applied to the first node (N1) is applied to the third node (N3). In addition, the third node (N3) and the fourth node (N4) are set to have the same voltages since the voltage value of the third node (N3) is supplied to the fourth node (N4) via the second buffer 260_j_.

Then, the voltage generating unit 400_j_ divides the compensation voltage applied to the fourth node (N4) and the voltage of the second reference power supply (Vref2) to generate a plurality of enhancement voltages (V0 to $V2^k-1$), and supplies the generated enhancement voltages (V0 to $V2^k-1$) to the DAC 250_j_. The DAC 250_j_ selects as the data signal (DS) an $h^{th}$ (h is a lower integral number than an integral number f) enhancement voltage of the f number (f is an integral number) of enhancement voltages so as to correspond to the digital value of the data.

The boosting unit 410_j_ enhances the voltage of the data signal (DS) supplied from the DAC 250_j_ as much as the voltage-dropping voltage (ΔV). Actually, the boosting unit 410_j_ generates the voltage-dropping voltage (ΔV) by subtracting the voltage of the second reference power supply (Vref2) from the voltage of the first reference power supply (Vref), and boosts the voltage of the data signal (DS) as much as the generated voltage-dropping voltage (ΔV). Then, a voltage as in the Equation 7 is supplied to the first buffer 270_j_. On the other hand, the boosting unit 410_j_ may receive the voltage-dropping voltage (ΔV) from the outside and boost the voltage of the data signal (DS) as much as the supplied voltage-dropping voltage (ΔV).

Subsequently, the eleventh transistor (M11) turns on during the second period of the horizontal interval, and then the voltage supplied to the first buffer 270*j* is supplied to the first node (N1). Then, a voltage as in the Equation 7 is supplied to the first node (N1), and a voltage as in the Equation 8 is supplied to the second node (N2). At this time, a current as in the Equation 9 flows in the fourth transistor (M4). That is, in the data driving circuit 200 according to the third embodiment of the present invention, the other operating processes are identical to those of the data driving circuit 200 according to the first embodiment of the present invention except that only a process of compensating voltage-dropping voltage (ΔV), which is generated by the data line (Dj) when the current is sunk, is further included.

Figure 16:
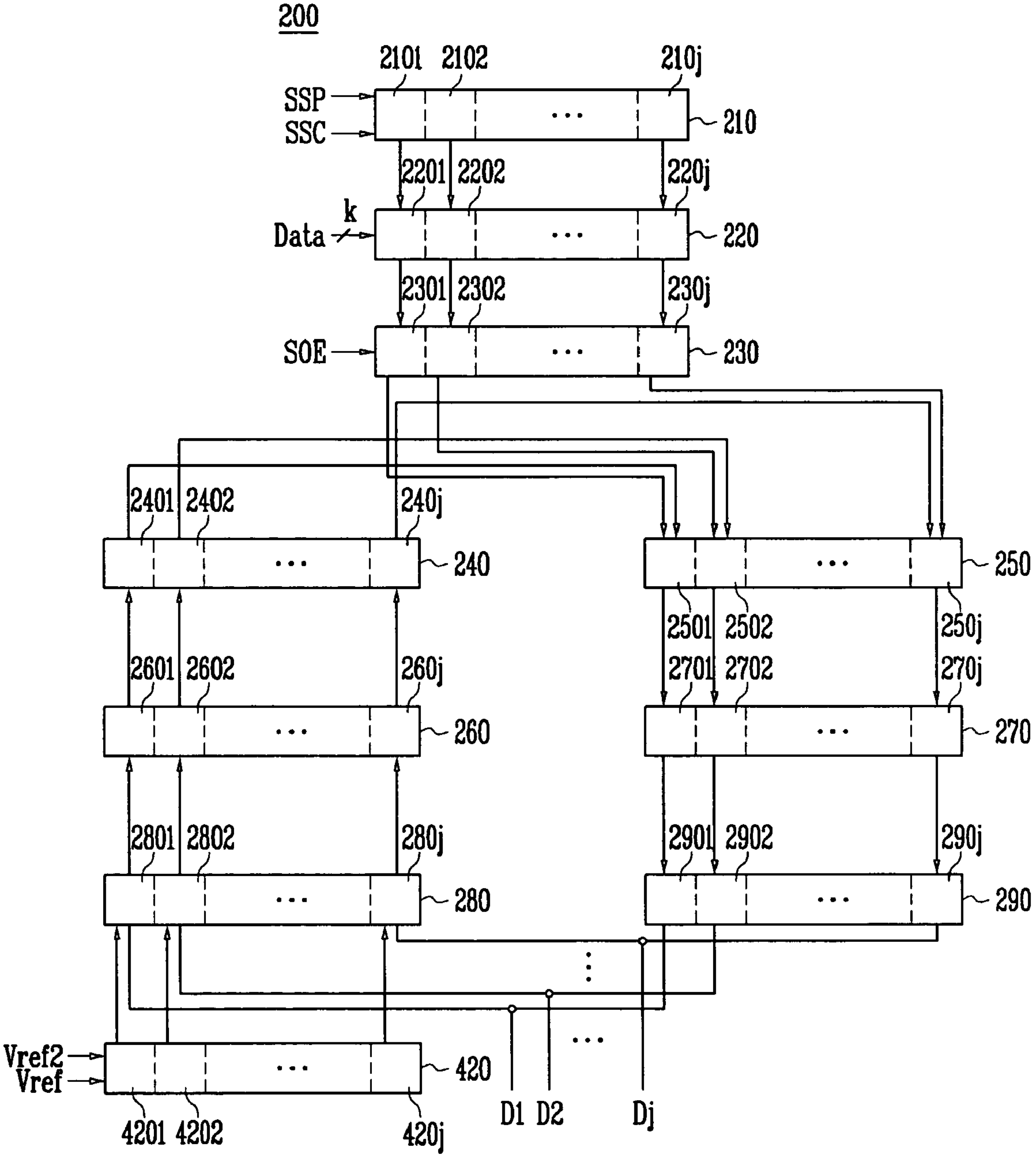
FIG. 16 is a block diagram showing a fifth embodiment of the data driving circuit shown in FIG. 2.

FIG. 16 is a block diagram showing a fifth embodiment of the data driving circuit shown in FIG. 2. In FIG. 16, elements that have the same reference numerals as in FIG. 6 are configured substantially the same, and therefore their detailed descriptions are omitted.

Referring to FIG. 16, the data driving circuit 200 according to the fifth embodiment of the present invention includes the shift register unit 210, the sampling latch unit 220, the holding latch unit 230, the gamma voltage unit 240, the DAC unit 250, the first buffer unit 270, the second buffer unit 260, the current supplying unit 280, the selecting unit 290, and boosting block 420.

The boosting block 420 is positioned to be connected with the current supplying unit 280. Such a boosting block 420 includes the j number of boosting units 4201 to 420*j*. Each of the boosting units 4201 to 420*j* is connected with any (or a corresponding) one of the current sinking units 2801 to 280*j* to boost the voltage value of the compensation voltage generated in the current sinking unit 2801 to 280*j*. Actually, each of the boosting units 4201 to 420*j* receives the voltage of the first reference power supply (Vref) and the voltage of the second reference power supply (Vref2), and boosts the voltage (ΔV) corresponding to difference between the voltage of first reference power supply (Vref) and the voltage of the second reference power supply (Vref2). That is, each of the boosting units 4201 to 420*j* boosts the compensation voltage as much as the voltage-dropping voltage (ΔV) generated by loading of the data line.

The gamma voltage unit 240 includes the j number of voltage generating units 2401 to 240*j* for generating a predetermined enhancement voltage to correspond to the data of the k bits. Each of the voltage generating units 2401 to 240*j* is composed of a plurality of partial potential resistances (R1 to Rl) to generate the $2^k$ number of the enhancement voltages. Actually, the partial potential resistances (R1 to Rl) divide the voltage of the first reference power supply (Vref) and the compensation voltage supplied from the second buffer unit 260 to generate the enhancement voltages, and supply the generated enhancement voltages to the DACs 2501 to 250*j*. That is, the gamma voltage unit 240 divides the voltages between the first reference power supply (Vref) and the compensation voltage because it receives the compensation voltage boosted by the boosting block 420. Also, the data driving circuit 200 of the present invention may further include a level shifter unit 300 as in FIG. 13 connected to (as a next unit of) the holding latch unit 230.

Figure 17:
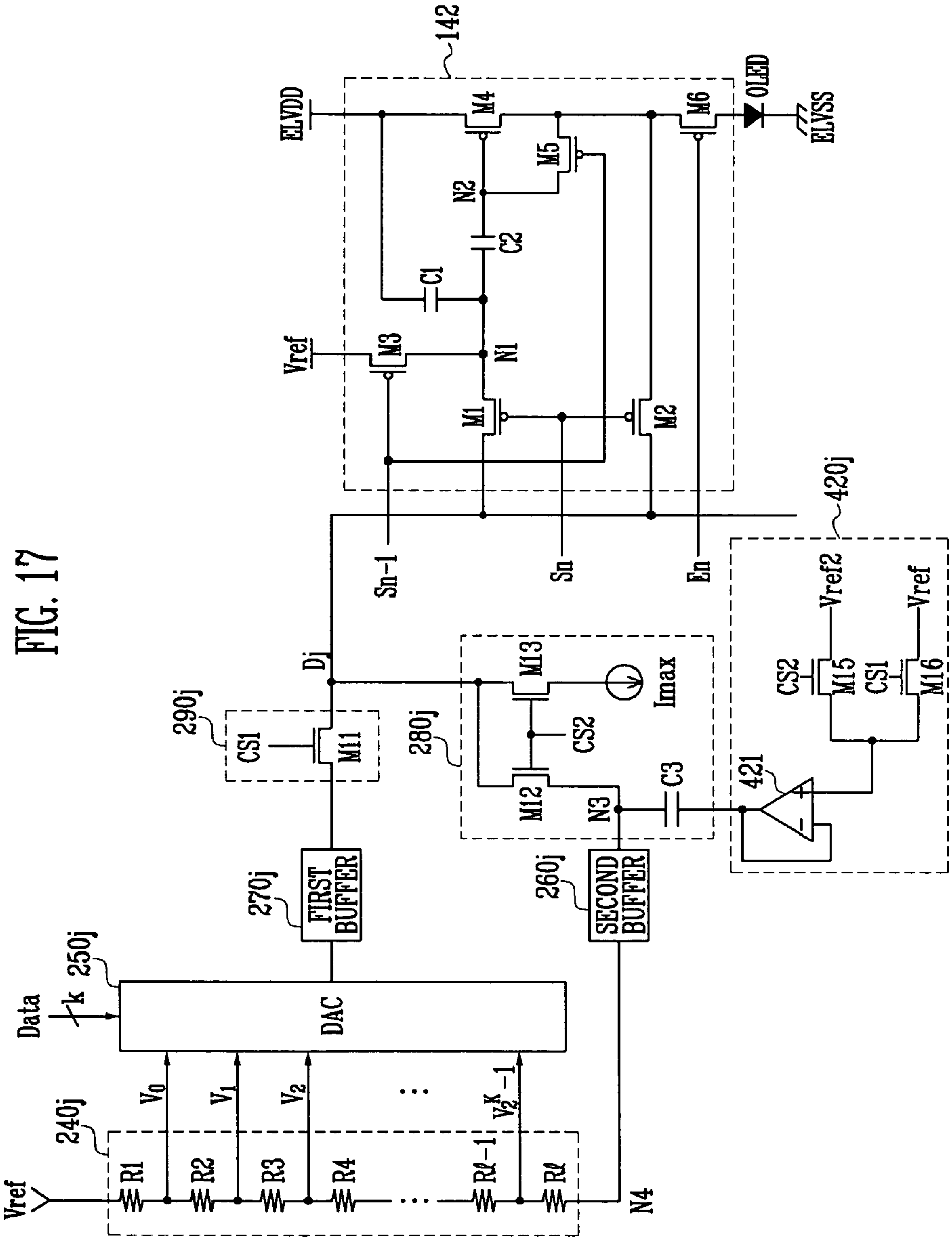
FIG. 17 is diagram showing an example of connecting correlation of a voltage generating unit, a digital-analog converter, a boosting unit, a first buffer, a second buffer, a switching unit, a current sinking unit, and a pixel shown in FIG. 16.

FIG. 17 is a diagram showing connecting correlations of a voltage generating unit, a DAC, a first buffer, a second buffer, a switching unit, a current sinking unit, a boosting unit, and a pixel mounted on a specific channel. It is assumed that, for convenience of the description, FIG. 17 shows a $j^{th}$ channel, the pixel circuit 142 shown in FIG. 3, and the data line (Dj), connected with the pixel 140 shown in FIG. 3. Here, although the pixel circuit 142' shown in FIG. 5 can also be connected to the data line (Dj), an operating process in which the pixel circuit 142' of FIG. 5 is connected to the data line (Dj) is omitted since the boosting unit 420*j* has substantially the same operating process as will be described for the pixel circuit 142 of FIG. 3.

Referring to FIG. 17, the boosting unit 420*j* is connected to one side terminal of the third capacitor (C3). Such a boosting unit 420*j* includes a third buffer 421, a fifteenth transistor (M15) and a sixteenth transistor (M16). The first electrode of the fifteenth transistor (M15) is connected to the second reference power supply (Vref2), and the second electrode is connected to the third buffer 421. In addition, the gate electrode of the fifteenth transistor (M15) receives the second controlling signal (CS2). Such a fifteenth transistor (M15) turns on during the first period of the horizontal interval (H), and turns off during the second period.

The first electrode of the sixteenth transistor (M16) is connected to the first reference power supply (Vref), and the second electrode is connected to the third buffer 421. In addition, the gate electrode of the sixteenth transistor (M16) receives the first controlling signal (CS1). Such a sixteenth transistor (M16) turns on during the second period of the horizontal interval (H), and turns off during the first period.

The third buffer 421 supplies the voltage of the second reference power supply (Vref2) or the first reference power supply (Vref) from the fifteenth transistor (M15) or the sixteenth transistor (M16) to one side terminal of the third capacitor (C3).

An operating process of the boosting unit 420*j* will be described in more detail with reference to FIGS. 9 and 17. First, a voltage as in the Equations 1 and 2 are respectively applied to the first node (N1) and the second node (N2) when the scanning signal is supplied to the $(n-1)^{th}$ scanning line (Sn−1).

Subsequently, a voltage value as in the Equation 5 is applied to the first node (N1) to correspond to the current value which is sunk by the current source (Imax) during the first period of the interval when the scanning signal is supplied to the $n^{th}$ scanning line (Sn). In addition, a voltage as in the Equation 13 is applied to the third node (N3) by loading of the data line (Dj). That is, a voltage value formed by subtracting the voltage-dropping voltage (ΔV) via the data line (Dj) from the voltage value applied to the first node (N1) is applied to the third node (N3). In addition, the fifteenth transistor (M15) turns on during the first period, and then the voltage of the second reference power supply (Vref2) is applied to one side terminal of the third capacitor (C3).

A voltage as in the Equation 13 is applied to the third node (N3), and then the fifteenth transistor (M15) turns off and the sixteenth transistor (M16) turns on during the second period. The voltage of the first reference power supply (Vref) is applied to one side terminal of the third capacitor (C3) if the sixteenth transistor (M16) turns on. Here, the voltage value of the third node (N3) is increased as much as the voltage-dropping voltage (ΔV) since the voltage value formed by subtracting the voltage of the second reference power supply (Vref2) from the voltage of the first reference power supply (Vref) is set to the voltage-dropping voltage (ΔV) of the data line (Dj). That is, a voltage as in the Equation 5 is applied to the third node (N3) and the fourth node (N4) when the sixteenth transistor (M16) turns on.

Subsequently, the voltage generating unit 240*j* divides the compensation voltage applied to the fourth node (N4) and the voltage of the first reference power supply (Vref) to generate a plurality of enhancement voltages ($V0$ to $V2^k-1$), and supplies the generated enhancement voltages ($V0$ to $V2^k-1$) to the DAC 250*j*. The DAC 250*j* selects as the data signal (DS) an $h^{th}$ (h is a lower integral number than an integral number f) enhancement voltage of the f number (f is an integral number) of enhancement voltages so as to correspond to the digital value of the data. Then, a voltage as in the Equation 7 is supplied to the first buffer 270*j*.

In addition, the voltage supplied to the first buffer 270*j* is supplied to the first node (N1) because the eleventh transistor (M11) turns on during the second period. Then, a voltage as in the Equation 7 is supplied to the first node (N1), and a voltage as in the Equation 8 is applied to the second node (N2). At this time, a current as in the Equation 9 flows into the fourth transistor (44). That is, in the data driving circuit 200 according to the third embodiment of the present invention, the other operating processes are identical to those of the data driving circuit 200 according to the first embodiment of the present invention except that only a process of compensating the voltage drop or voltage-dropping voltage (ΔV), which is generated by the data line (Dj) when the current is sunk, is further included.

In view of the foregoing, it should be understood that the terms used in the specification and appended claims should not be construed as limited to general and dictionary meanings, but interpreted based on the meanings and concepts corresponding to technical aspects of the present invention on the basis of the principle that the inventors are allowed to define terms appropriately for the best explanation.

As described above, according to the data driving circuit, the light emitting display using the same, and the driving method of the light emitting display, an even (or uniform) image may be displayed regardless of the mobility of the transistor by resetting the voltage values of the enhancement voltages generated in the voltage generating unit using the compensation voltage generated when the current is sunk from the pixel and supplying the reset enhancement voltage to the pixel to which the current is sunk. In addition, the image of the desired brightness may also be displayed in the pixels since the voltage-dropping voltage of the compensation voltage generated by the data line may be compensated in the present invention.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A data driving circuit of a display device comprising:

at least one current sinking unit for receiving a predetermined current flowing through a data line and through a transistor coupled between a power supply and a light emitting diode;

at least one voltage generating unit for adjusting voltage values of enhancement voltages using a compensation voltage generated when the predetermined current flows;

at least one digital-analog converter for selecting as a data signal one of the enhancement voltages to correspond to a digital value of externally supplied data;

at least one boosting unit for boosting a voltage value of the data signal in accordance with a voltage drop of the data line caused by the predetermined current flowing through the data line; and at least one switching unit for providing the data line with the boosted data signal.

2. The data driving circuit of the display device according to claim 1, wherein the at least one boosting unit boosts the voltage value of the data signal in response to a voltage-dropping voltage of the compensation voltage generated by an electrical load of the data line.

3. The data driving circuit of the display device according to claim 2, wherein the data line is connected with a pixel, the pixel is charged with a voltage using a voltage difference between a first reference power supply and the boosted data signal, and a driving current is controlled to flow from a first power supply to a light emitting diode so as to correspond to the charged voltage.

4. The data driving circuit of the display device according to claim 3, wherein the at least one boosting unit receives a voltage of the first reference power supply and a voltage of a second reference power supply, and boosts the voltage value of the data signal to as much as a voltage difference between the first reference power supply and the second reference power supply, and wherein the voltage of the second reference power supply is set by subtracting the voltage-dropping voltage from the voltage of the first reference power supply.

5. The data driving circuit of the display device according to claim 4, wherein the at least one voltage generating unit comprises a plurality of partial potential resistances for generating the enhancement voltages, the partial potential resistances being mounted between a first side terminal for receiving the voltage of the second reference power supply and a second side terminal for receiving the compensation voltage.

6. The data driving circuit of the display device according to claim 1, wherein the at least one current sinking unit receives the predetermined current during a first period of a horizontal interval.

7. The data driving circuit of the display device according to claim 6, further comprising a pixel, wherein the predetermined current is set to a current value being substantially the same as a current flowing when the pixel is light emitted with a maximum brightness.

8. The data driving circuit of the display device according to claim 7, wherein the at least one current sinking unit comprises:

a current source for receiving the predetermined current;

a first transistor mounted between the data line and the at least one voltage generating unit to turn on during the first period;

a second transistor mounted between the data line and the current source to turn on during the first period; and a capacitor for charging the compensation voltage.

9. The data driving circuit of the display device according to claim 6, wherein the at least one switching unit comprises at least one transistor for connecting the at least one boosting unit with the data line during a second period of the horizontal interval, and wherein the first period differs from the second period.

10. The data driving circuit of the display device according to claim 9, wherein the at least one transistor comprises at least two transistors connected in a transmission-gate form.

11. The data driving circuit of the display device according to claim 1, further comprising:

a first buffer mounted between the at least one boosting unit and the at least one switching unit; and a second buffer mounted between the at least one current sinking unit and the at least one voltage generating unit.

12. The data driving circuit of the display device according to claim 1, wherein the at least one current sinking unit, the at least one voltage generating unit, the at least one digital-analog converter, the at least one boosting unit, and the at least one switching unit are all mounted on a channel of the data driving circuit of the display device.

13. The data driving circuit of the display device according to claim 1, further comprising:

a shift register unit including shift registers for generating sampling signals;

a sampling latch unit including sampling latches for receiving the data in response to the sampling signals; and a holding latch unit including holding latches for receiving the data stored in the sampling latches and supplying the data stored in the holding latches to the at least one digital-analog converter.

14. The data driving circuit of the display device according to claim 13, further comprising a level shifter unit for increasing a voltage level of the data stored in the holding latch unit before supplying the data to the at least one digital-analog converter.

15. A light emitting display device comprising:

a display region including a plurality of pixels connected with a scanning line, a data line, and a light-emitting controlling line;

a scan driver for supplying a scanning signal to the scanning line, and supplying a light-emitting controlling signal to the light-emitting controlling line; and a data driving circuit for supplying a data signal to the data line, wherein the data driving circuit comprises at least one current sinking unit for receiving a predetermined current flowing through a data line and through a transistor coupled between a power supply and a light emitting diode;

at least one voltage generating unit for adjusting voltage values of enhancement voltages using a compensation voltage generated when the predetermined current flows;

at least one digital-analog converter for selecting as a data signal one of the enhancement voltages to correspond to a digital value of an externally supplied data;

at least one boosting unit for boosting a voltage value of the data signal in accordance with a voltage drop of the data line caused by the predetermined current flowing through the data line; and at least one switching unit for providing the data line with the boosted data signal.

16. The light emitting display device according to claim 15, wherein the scan line comprises a current scanning line and a previous scanning line, and wherein each of the pixels comprises:

a light emitting diode for receiving a current from a first power supply;

a first transistor and a second transistor connected with the data line at their first electrodes and adapted to turn on when the current scanning line is supplied with the scanning signal;

a third transistor connected between a second electrode of the first transistor and a first reference power supply and adapted to turn on when the previous scanning line is supplied with the scanning signal;

a fourth transistor for controlling a current level supplied to the light emitting diode; and a fifth transistor for connecting the fourth transistor in a diode form, the fifth transistor being connected between a gate electrode of the fourth transistor and a second electrode of the fourth transistor and adapted to turn on when the scanning signal is supplied to the previous scanning line.

17. The light emitting display device according to claim 16, wherein each of the pixels comprises:

a first capacitor connected between the second electrode of the first transistor and the first power supply; and a second capacitor connected between the second electrode of the first transistor and the gate electrode of the fourth transistor.

18. The light emitting display device according to claim 16, wherein each of the pixels comprises:

a first capacitor connected between a gate electrode of the fourth transistor and the first power supply; and a second capacitor connected between the second electrode of the first transistor and the gate electrode of the fourth transistor.

19. The light emitting display device according to claim 16, further comprising a sixth transistor connected between the second electrode of the fourth transistor and the light emitting diode, adapted to turn off when the light-emitting controlling signal is supplied, and adapted to turn on during other intervals.

20. A method for driving a light emitting display device comprising:

controlling a predetermined current to flow in a data line connected with a pixel and through a transistor coupled between a power supply and a light emitting diode;

generating a compensation voltage corresponding to the predetermined current;

controlling voltage values of enhancement voltages using the compensation voltage;

selecting as a data signal one of the enhancement voltages to correspond to a digital value of an externally supplied data; and boosting a voltage value of the data signal in accordance with a voltage drop of the data line caused by the predetermined current flowing through the data line and supplying the boosted data signal to the data line.

21. The method for driving a light emitting display device according to claim 20, wherein the controlling the predetermined current comprises setting the predetermined current to a current value being substantially the same as a current flowing in the data line when the pixel is light emitted with a maximum brightness.

22. The method for driving a light emitting display device according to claim 20, wherein the controlling the predetermined current comprises supplying the predetermined current from the pixel to a data driving circuit via the data line.

23. The method for driving a light emitting display device according to claim 20, wherein the boosting the voltage value of the data signal comprises boosting a voltage of the data signal on the data line to as much as a voltage-dropping voltage of the compensation voltage generated by its loading.

* * * * *